United States Patent

Hirai et al.

Patent Number: 5,347,140
Date of Patent: Sep. 13, 1994

[54] RESONANT ELECTRON TRANSFER DEVICE

[75] Inventors: Yoshihiko Hirai, Osaka; Kiyoshi Morimoto; Yasuaki Terui, both of Neyagawa; Atsuo Wada; Kenji Okada, both of Suita; Juro Yasui, Toyonaka; Masaaki Niwa, Hirakata, all of Japan

[73] Assignee: Matsushita Electric Industrial Co., Ltd., Kadoma, Japan

[21] Appl. No.: 935,988

[22] Filed: Aug. 27, 1992

[30] Foreign Application Priority Data

| Aug. 27, 1991 | [JP] | Japan | 3-215207 |
| Sep. 12, 1991 | [JP] | Japan | 3-232806 |
| Sep. 12, 1991 | [JP] | Japan | 3-232807 |
| Oct. 1, 1991 | [JP] | Japan | 3-253412 |
| Oct. 2, 1991 | [JP] | Japan | 3-255171 |
| Nov. 8, 1991 | [JP] | Japan | 3-292777 |

[51] Int. Cl.$^5$ ............................................. H01L 29/88
[52] U.S. Cl. ................................. 257/17; 257/20; 257/25
[58] Field of Search .................... 257/9, 20, 28, 17, 25, 257/773

[56] References Cited

U.S. PATENT DOCUMENTS 4,912,531 3/1990 Reed et al. .................. 257/17

FOREIGN PATENT DOCUMENTS

| 63-23357 | 1/1988 | Japan . |
| 64-39768 | 2/1989 | Japan . |
| 2-3142 | 1/1990 | Japan . |
| 3-214774 | 9/1991 | Japan . |

*Primary Examiner*—Robert Limanek
*Attorney, Agent, or Firm*—Wenderoth, Lind & Ponack

[57] ABSTRACT

A resonant electron transfer device includes a plurality of units each of which has of at least one one-dimensional quantum wire having a quantum well elongated in a direction, a zero-dimensional quantum dot having a base quantization level higher than that of the one-dimensional quantum wire an electrode for controlling respective internal levels of the quantum wire and dot wherein the quantum wire and dot forming one unit is connected via a potential barrier capable of exhibiting a tunnel effect therebetween.

6 Claims, 24 Drawing Sheets t = t1 t = t2 t = t3 t = t4 t = t5

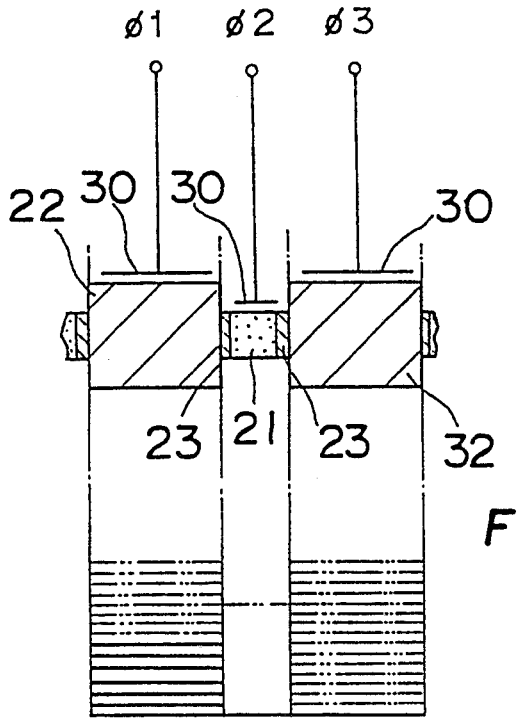
Fig. 5(a)
  initial state
  ø1=LOW, ø2=LOW,
  ø3=LOW
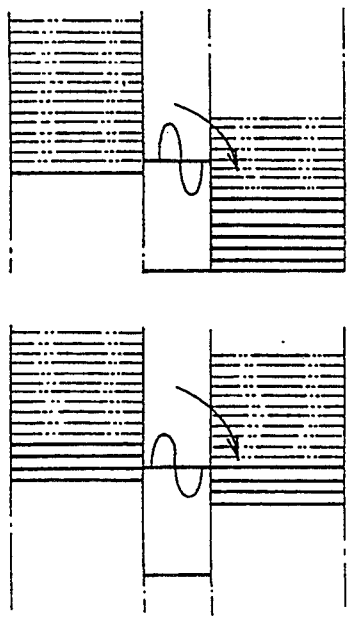
Fig. 5(b)
  control potential
  upon signal transmission
  ø1=LOW, ø2=HIGH,
  ø3=HIGH
Fig. 5(c)
  control potential upon
  signal branch
  ø1=LOW, ø2=HIGH,
  ø3=LOW+δ

ø2:On

ø1:On region 1  region 2  region 3

Energy state density          Fermi energy

Fig. 18(g) epitaxially grown silicon 86
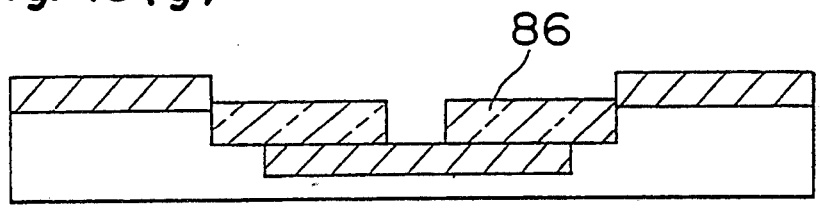
Fig. 18(h)
↓
87 oxide film
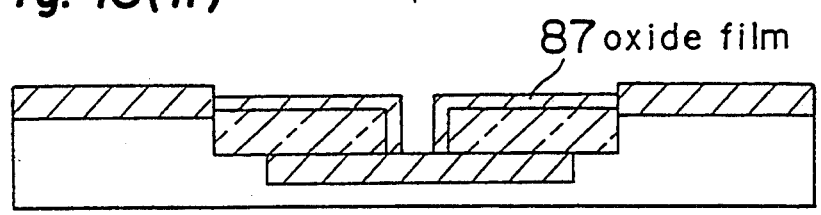
Fig. 18(i)
↓
88 polysilicon
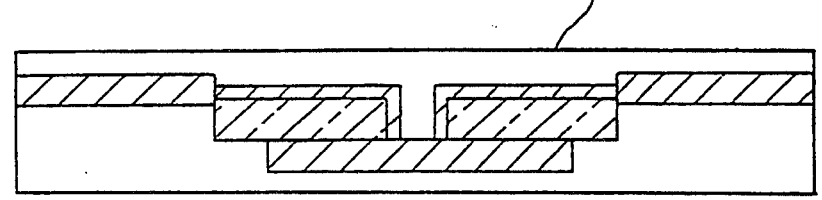
Fig. 18(j)
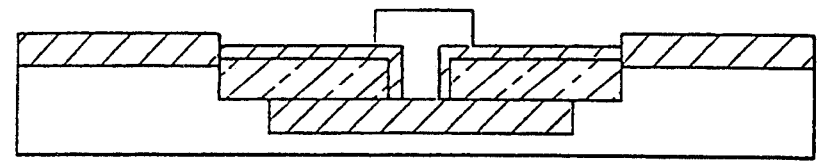
Fig. 18(k)
89 laser beam
90 monocrystalline silicon
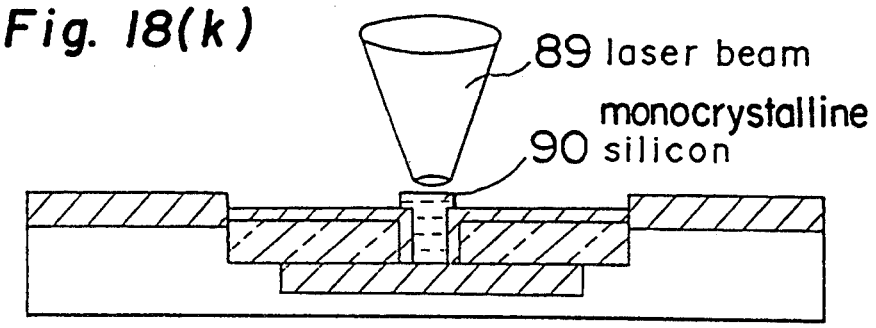

Fig. 20(a) mating margin in direction
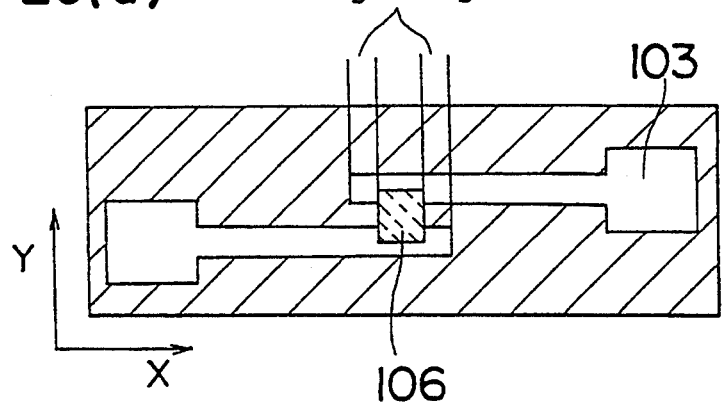
Fig. 20(b) mating margin in Y direction
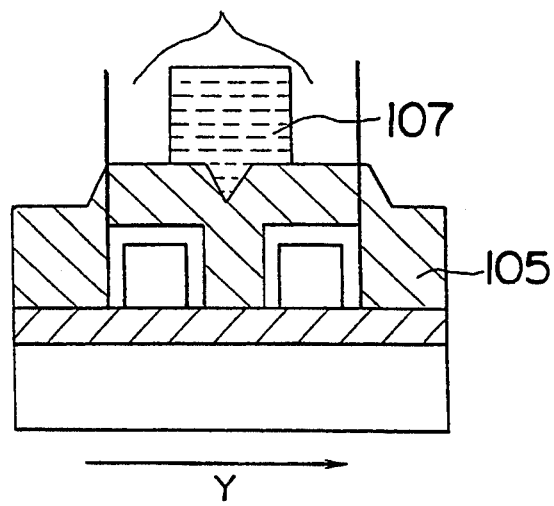
Fig. 20(c)
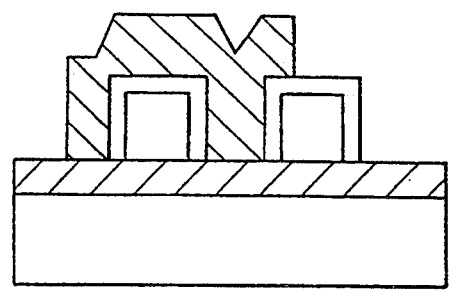
Fig. 20(d)
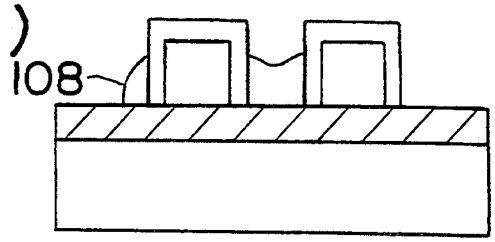

t = t1 t = t2 t = t3 t = t4 t = t5 t = t6 t = t7 oxygen ion implanting

RESONANT ELECTRON TRANSFER DEVICE

BACKGROUND OF THE INVENTION

1. Field of the Invention

The present invention relates to an device which uses a quantum effect.

2. Description of the Prior Art

Owing to the progress of semiconductor techniques, the miniaturization of devices and the high integration of devices have been progressing. Due to the miniaturization of the devices, the normal operation of the devices is being prevented by various physical limits including the quantum effect. Accordingly, it is necessary to develop a new device which different from the conventional transistor.

Among the devices to carry out signal processing by propagating electron signals, conventional charge transfer devices having functions carried out by spatially transferring electric charges including, for example, Charged Coupled Devices (hereinafter abbreviated as CCDs) were proposed by Boyl and Smith, Bell Research Institute, U.S.A. in 1970. FIG. 21 is a structural view of a CCD device which is a conventional charge transfer device. In FIG. 21, element 140 is a p-type silicon substrate; element 142 is a silicon oxide film, and element 144 is an electrode; the device has an MOS capacitor integrated structure. FIG. 22 shows a schematic view of a section of a 2 bit n-channel CCD device, wherein element 140 is a p-type silicon substrate; elements 141 and 143 are n-type doping layers; element 142 is a silicon oxide film, and element 144 is an electrode. Alphabetical symbols in FIG. 22 show the control signals on each electrode 144. ID denotes an input signal to an input diode; IG denotes an input control electrode signal; $\phi 1$, $\phi 2$, and $\phi 3$ denote control signals; OG denotes an output control electrode signal, and OD denotes an output diode signal. FIGS. 23(a) and 23(b) respectively show a schematic view of the section of the CCD device shown in FIG. 22 and a time chart of the control signals such as ID, IG, etc. FIGS. 24(a) and 24(b) respectively show a schematic view of the section of the CCD device shown in FIG. 22 and an explanatory view showing a time transition of the internal potential and the state of charge transfer. Each time t1–t7 of FIG. 24(b) corresponds respectively to t1–t7 as shown in the time chart of FIG. 23(b).

Next, the principle of the charge transfer of the CCD device of FIG. 22 is briefly explained. In FIGS. 23(a)–23(b) and FIGS. 24(a)–24(b), when t=t1, because the input diode signal ID is applied in the inverse bias direction, no signal charge (electron which is decimal carrier) is injected even when the input control electrode signal IG and the control signal $\phi 1$ are ON. At t=t2, the input diode is biased in the normal direction, and an electron starts to be injected to the potential well under the initial electrode to which $\phi 1$ is applied, the electron being injected until the level becomes the same as the potential of the input diode. At t=t3, the input diode is again inverse biased. Subsequently, using the control signals $\phi 1$, $\phi 2$, $\phi 3$ of the control electrode, the potentials under the control electrode are varied from left to right in order, by which it is known that the signal charges are also transferred from left to right.

On the other hand, in 1984, a three-terminal quantum device for arranging the quantum dots in parallel was proposed by Reed, et. al of Texas Instruments, Inc., U.S.A. (U.S. Pat. No. 4,912,531: Three-terminal Quantum Device). FIG. 25 is a constitution view of conventional quantum device. In FIG. 25, elements 202 and 204 are quantum dots. Elements 206 and 210 are source and drain electrodes. Also, the quantum dot 202 is connected to the control electrode 208. FIGS. 26(a) and 26(b) show energy structural views when the bias is not applied to the source/drain terminals and when it is applied, respectively. By appropriate bias, the dissipated energy levels between the quantum dots 202 and 204 agree, and the signal electron is propagated from the source to the drain. By further combining a plurality of these quantum dots in an organic state, a device using the quantum dots and having a logic operating function is proposed.

On the other hand, the present applicant has already proposed the methods for producing quantum devices in Japanese Patent Application Nos. HEI3-180830–180834 and the like. When these production methods are applied, as the method for producing the device having the quantum dot or quantum wire, the following method is considered. FIGS. 27(a)–27(e) show a process for forming a conventional device. In FIGS. 27(a)–27(e), element 321 is a ridge line formed by anisotropic etching a silicon substrate; element 322 is a one-dimensional quantum wire; element 323 is a separated oxide; element 324 is a resist; element 325 is a silicon oxide; element 326 is a one-dimensional quantum wire; element 327 is a quantum dot, and element 328 is a tunnel oxide film. With respect to the forming process of the quantum device constituted as above, the flow for making it is explained below.

In FIG. 27(a), a ridge line 321 is formed by anisotropic etching the silicon substrate. In FIG. 27(b), a separation oxide film 323 is formed on the lower part of the ridge line 321. In FIG. 27(c), a resist 324 is formed as an oxygen ion injection mask. In FIG. 27(d), oxygen ion injection is carried out to form a silicon oxide 325. In FIG. 27(e), the resist 324 is removed to give a one-dimensional quantum wire 326, a quantum dot 327, and a tunnel oxide film 328. Propagation takes place by the resonant tunnel effect.

However, according to the conventional semiconductor device, as the size of the device enters into the region smaller than 0.1 $\mu$m, an improvement in the device performance according to the simple scaling rule to start to be inhibited due to various problems. This is due to the fact that: (1) the driving ability and controlling ability of the device no longer increase due to miniaturization but rather decrease; (2) nevertheless, parasitic loads such as wiring, device separation, etc. become large, and losses are caused to the propagation of electronic signals to make the normal device operation impossible.

Further, in the charge transfer device as above, the transfer of charge takes place by the spreading of the decimal carriers, and there has been a problem in that the improvement of the transfer rate is limited.

Moreover, the device formed by the combination of the quantum dots only shows a large loss of signal in the case where an electronic signal is propagated at a low loss for a certain distance and is connected to the device of the next step. Further, it cannot store information as in the conventional device.

In view of the above problems, the present invention provides a transfer device of a signal electron which has a high speed and small losses by positively utilizing the quantum effect which appears in the region not exceeding 0.1 μm and carrying out electron propagation by utilizing the resonant tunneling effect between the quantum levels separated in the one-dimensional quantum wire and zero-dimensional quantum dots.

SUMMARY OF THE INVENTION

In view of the problems as above, the present invention is to provide a method for producing a quantum device in which miniaturization is easy.

In order to solve the above problems, according to the present invention, there is provided a resonant electron transfer device which comprises a plurality of one-dimensional quantum wires each having a quantum well elongated in one direction, a plurality of zero-dimensional quantum dots each having a quantum well whose lowest quantum energy level is higher than that of said quantum wire of said one-dimensional quantum wire and a plurality of electrodes for controlling internal potentials of respective quantum wires and dots wherein said plurality of quantum wires and dots are arranged alternatively so as to form a predetermined connection structure and one of said quantum wires and one of said quantum dots adjacent to each other are connected via a potential barrier capable of exhibiting a tunnel effect therebetween and information is transmitted from one of the quantum wires to one of the quantum dots or vice versa by controlling voltages supplied to the plurality of electrodes.

By the means as described above, in the present invention, the electron propagation between the one-dimensional quantum wire and the zero-dimensional quantum dot is carried out by the resonant tunneling effect between the quantum levels. Accordingly, electron propagation at extremely high speed is possible. Also, as the energy level in the zero-dimensional quantum dot has small dispersion, leakage current, electron scattering, and energy loss are small, and signal propagation at a high efficiency becomes possible. Further, it becomes possible to store the signal information by utilizing the quantum effect.

Further, as the principles of reading out and writing in the data to the memory and data transfer are based on the propagation of the signal electron using the resonant tunneling effect between the dissipated quantum levels in the one-dimensional quantum wire and the zero-dimensional quantum dot, extremely high speed data input and output and transfers can be realized. Also, as the energy level in the zero-dimensional quantum dot is of a delta function form and has a small dispersion, it is possible to realize a memory device which has a small leakage current and ultra-low power consumption.

Furthermore, as the quantum wire is used as the electron propagation channel, scattering which is formed in the three-dimensional space can be suppressed, and the loss of signal is extremely small.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIGS. 5(a)–5(c) are a schematic sectional view of the resonant electron transfer device according to the second embodiment of the present invention and views showing the change in the internal potential;

FIGS. 18(g)–18(k) show a method for producing the resonant electron transfer device according to the seventh embodiment of the present invention;

FIGS. 20(a)–20(d) show the remaining steps of the method for producing the resonant electron transfer device according to the eighth embodiment of the present invention;

DETAILED DESCRIPTION OF THE PREFERRED EMBODIMENTS

Figure 1:
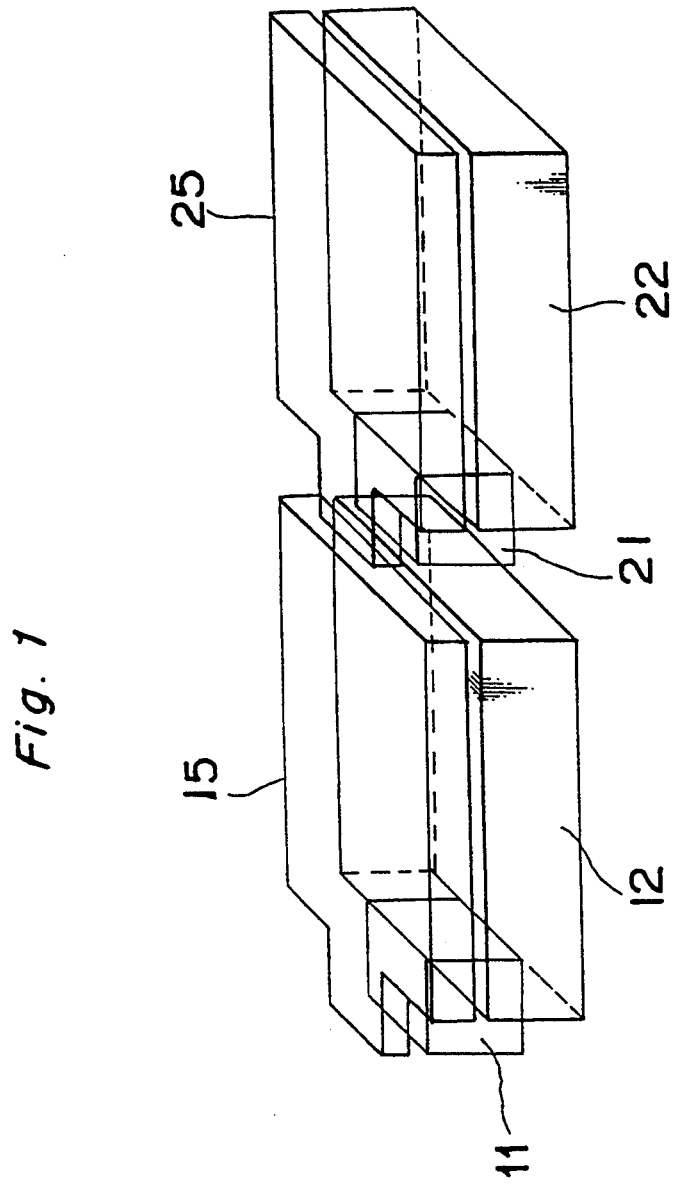
FIG. 1 is a schematic perspective view showing a resonant electron transfer device according to the first embodiment of the present invention.

FIG. 1 is a perspective view of the resonant electron transfer device according to one embodiment of the present invention. Elements 11 and 21 are zero-dimensional quantum dots; elements 10, 12 and 22 are one-dimensional quantum wires, and elements 15 and 25 are control electrodes. A constitution element is formed by a zero-dimensional quantum dot 11 having a length of a side of about several nanometers and a one-dimensional quantum wire 12 having a width of about several to several tens of nanometers, having a common control electrode 15. Similarly, a constitution element is formed by a zero-dimensional quantum dot 21 and a one-dimensional quantum wire 22, having a common control electrode 25. Though not shown in FIG. 1, the zero-dimensional quantum dot and the one-dimensional quantum wire are mutually connected through the medium of a potential barrier of a degree through which the electron can pass by a resonant tunneling effect (for example, an extremely thin silicon oxide film of no more than 3 nm).

Figure 2A:
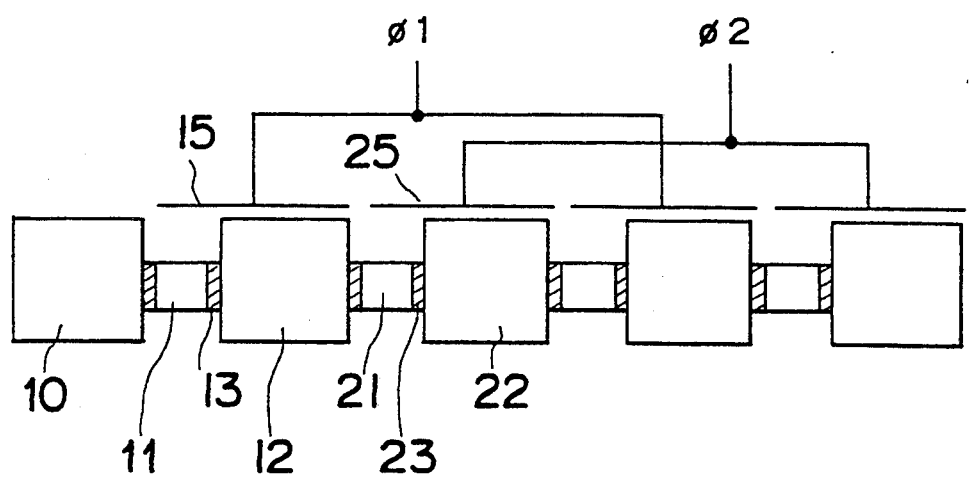
FIG. 2(a) is a schematic plan view of the resonant electron transfer device according to the first embodiment of the present invention.
Figure 2B:
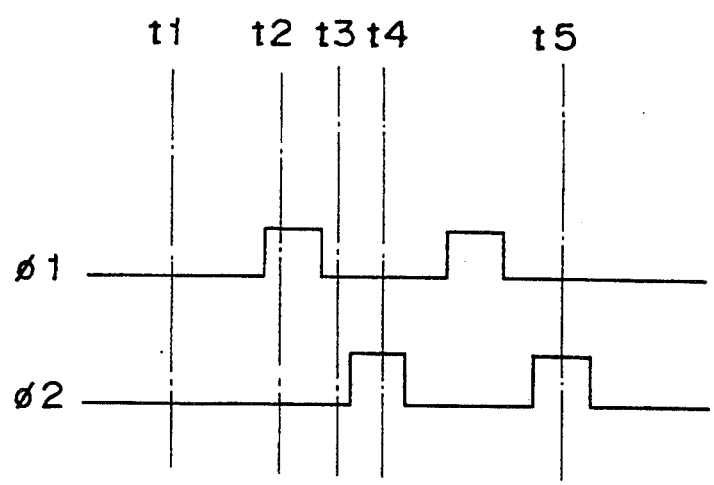
FIG. 2(b) is a time chart of the control signal.
Figure 3A:
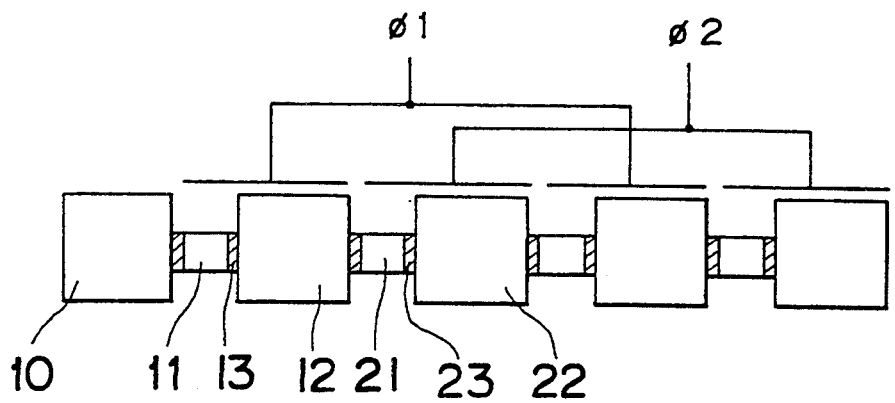
FIG. 3(a) is a schematic sectional view of the resonant electron transfer device according to the first embodiment of the present invention.
Figure 3B:
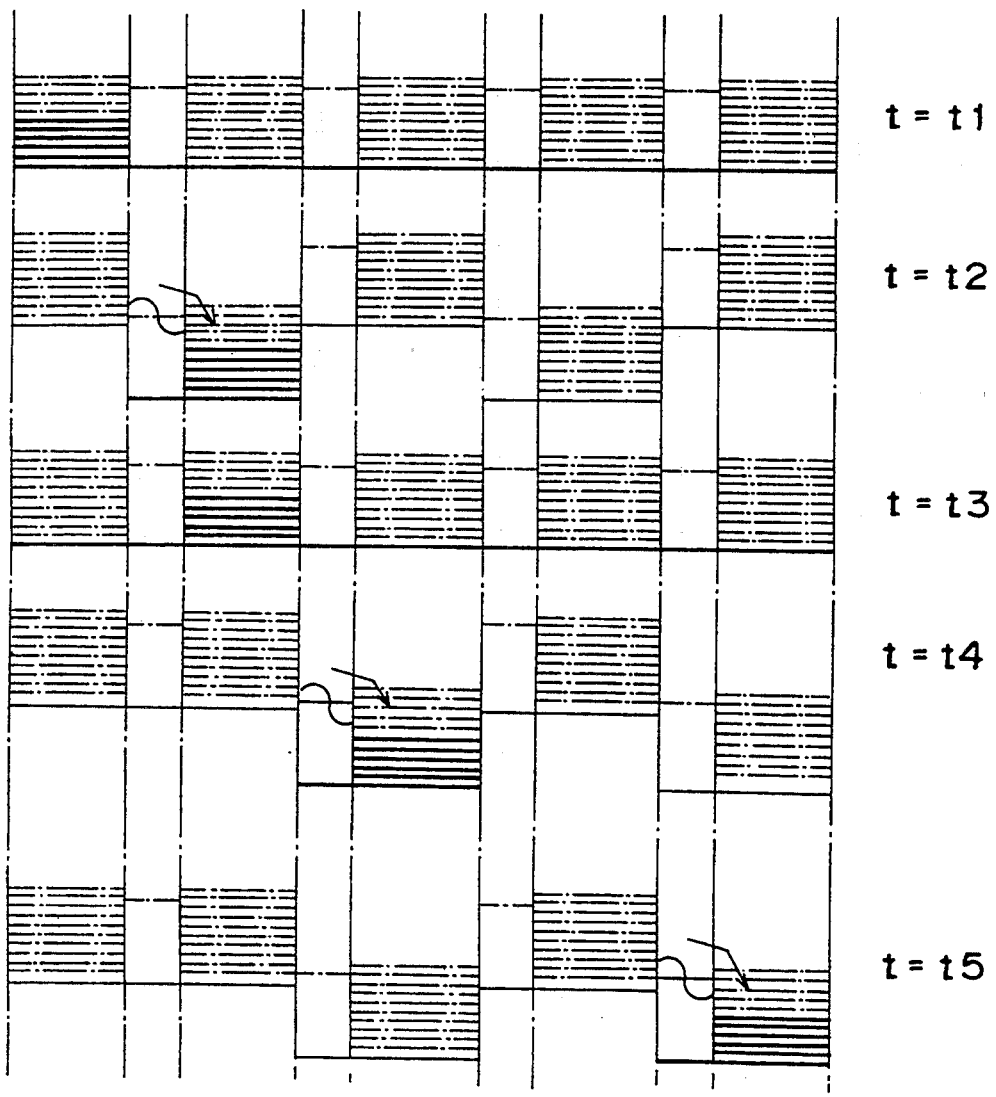
FIG. 3(b) is a view showing the change by time in the internal potential of the resonant electron transfer device according to the present invention.
Figure 22:
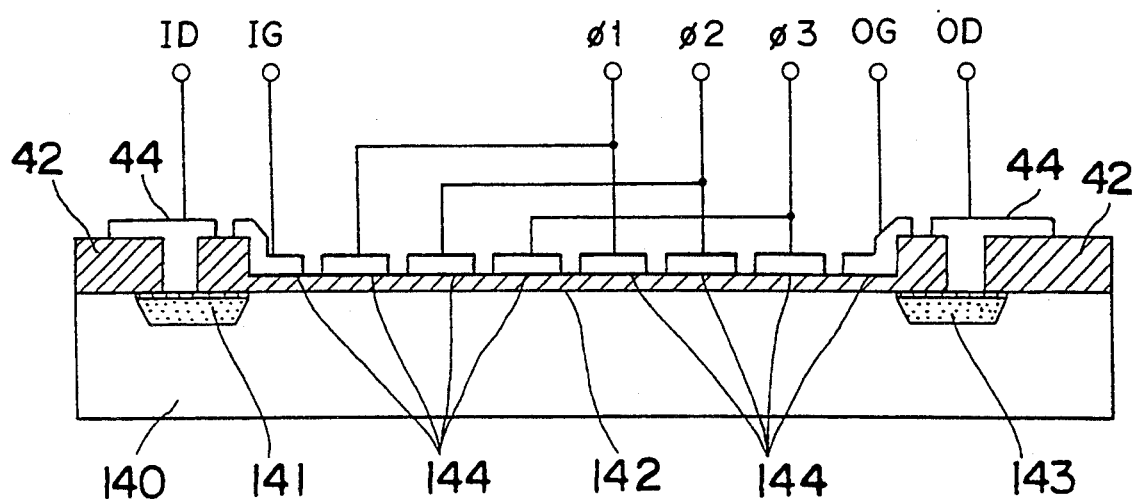
FIG. 22 is a constitutional sectional view of a conventional CCD.
Figure 23A:
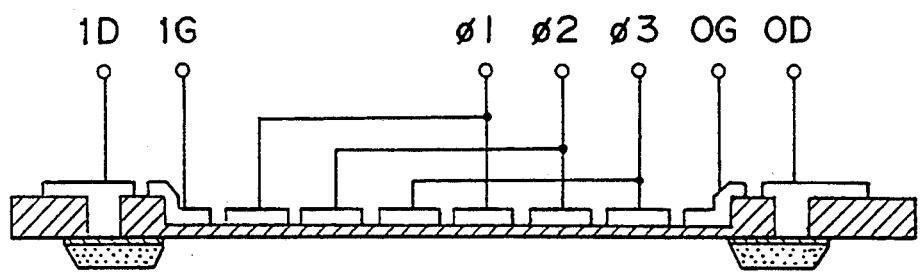
FIG. 23(a) is a constitutional sectional view of a conventional CCD.
Figure 23B:
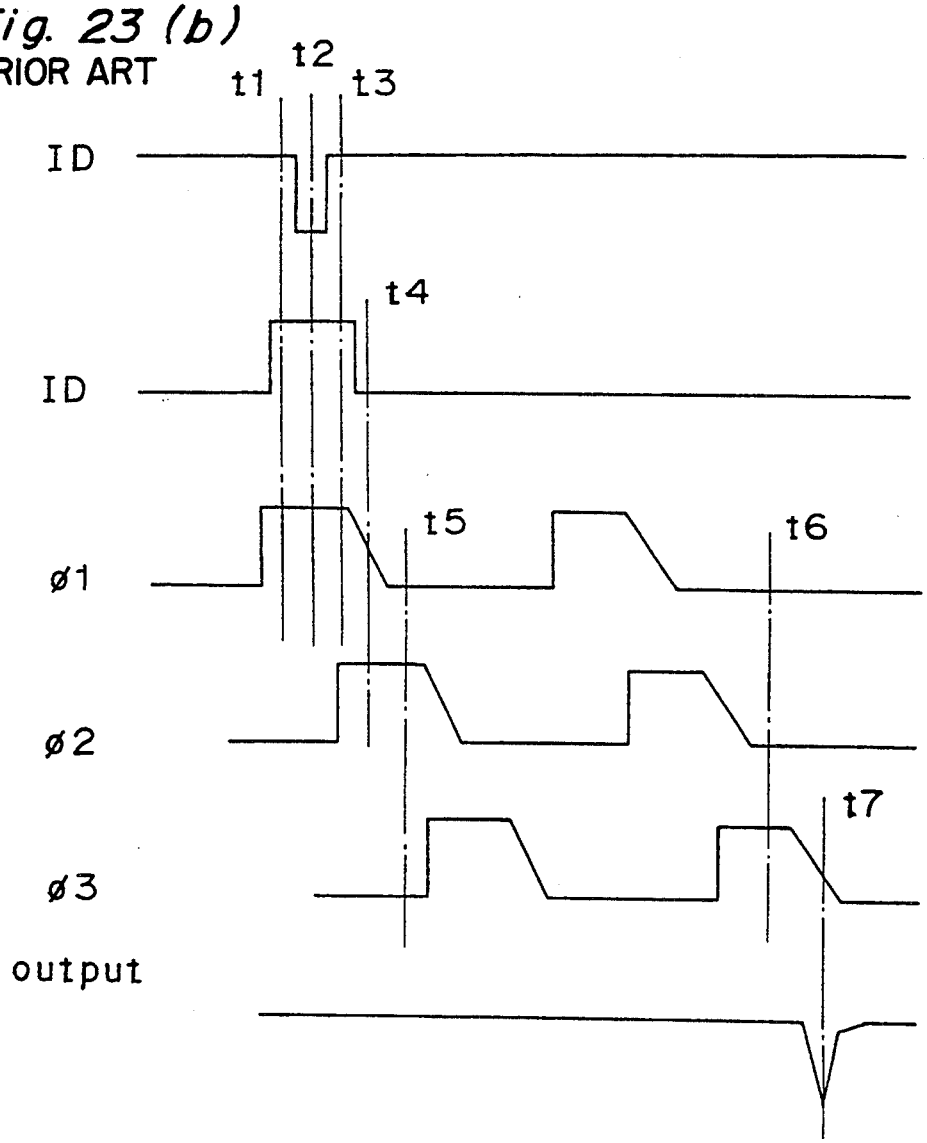
FIG. 23(b) is a time chart of the control signals of a conventional CCD.
Figure 24:
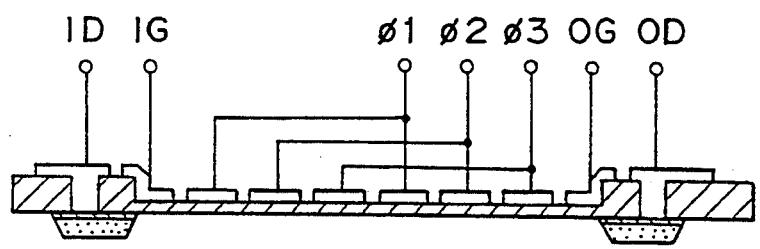
FIG. 24(a) is a constitutional sectional view of a conventional CCD.
FIG. 24(b) is a view showing the change by time of the internal potentials of the conventional CCD.
Figure 24:
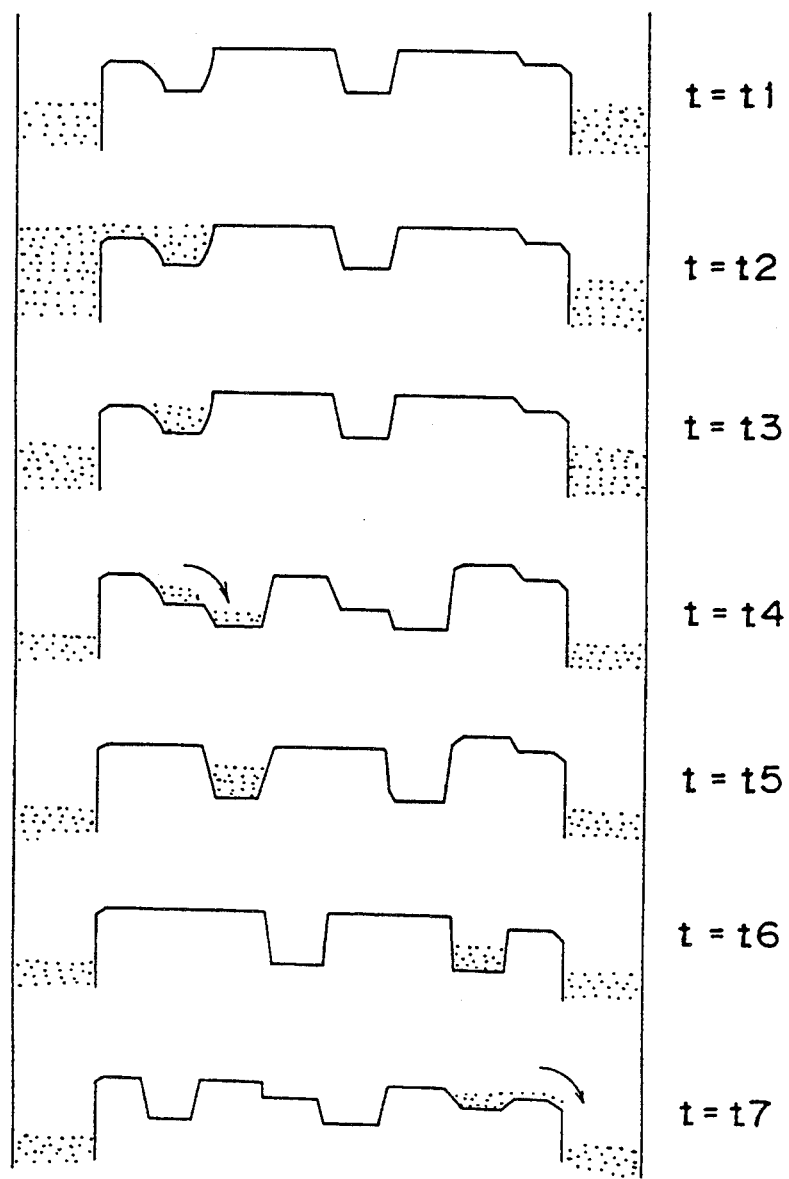
Figure 25:
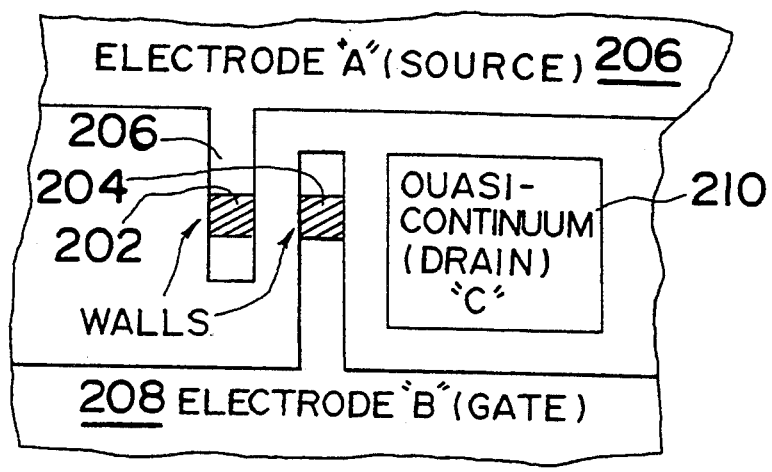
FIG. 25 is a constitutional view of a conventional quantum device.
Figure 26:
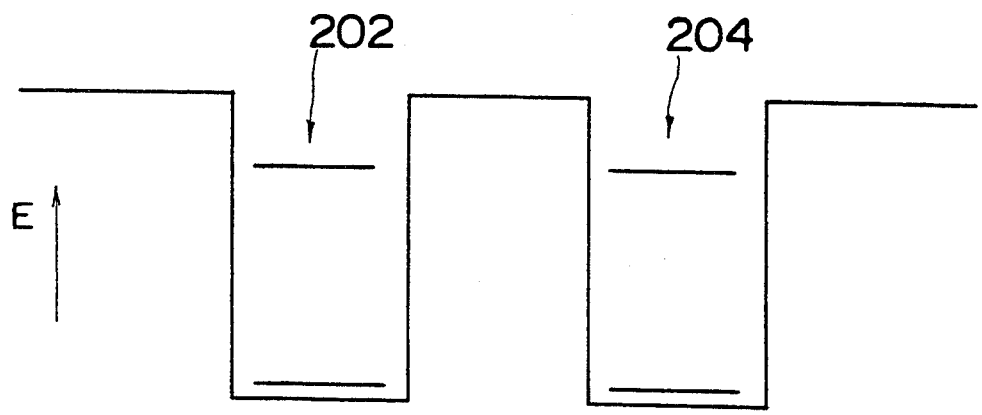
FIGS. 26(a) and 26(b) are energy structural views of a conventional quantum device for showing a charge transfer.
Figure 26:
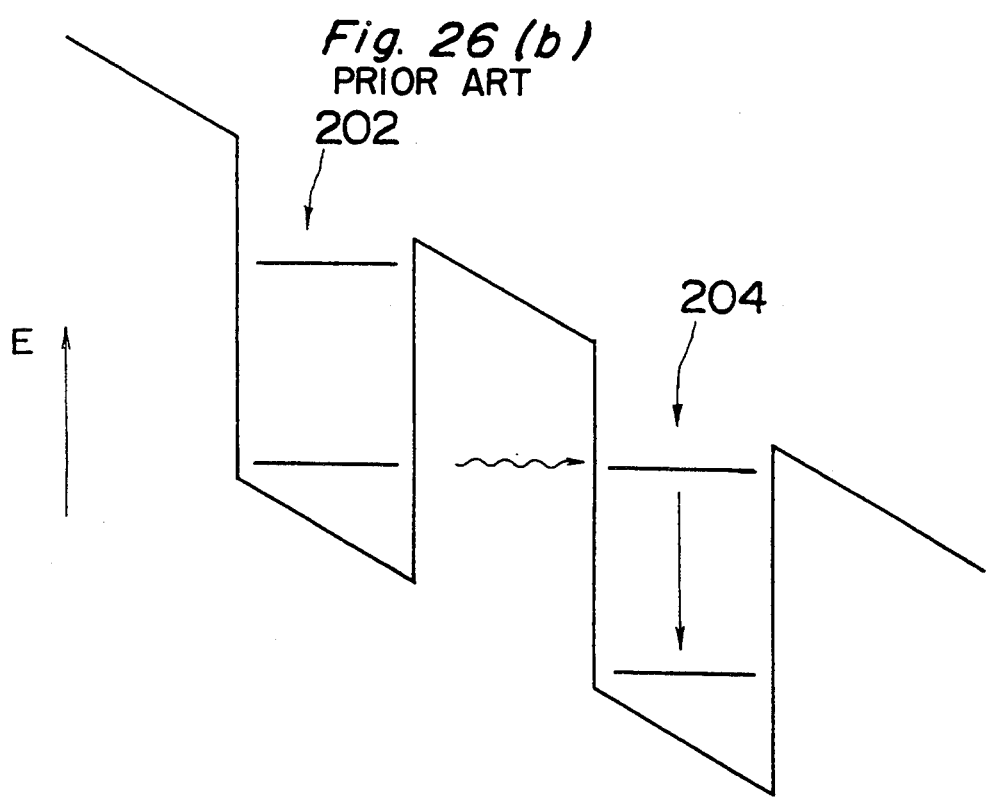
Figure 27A:
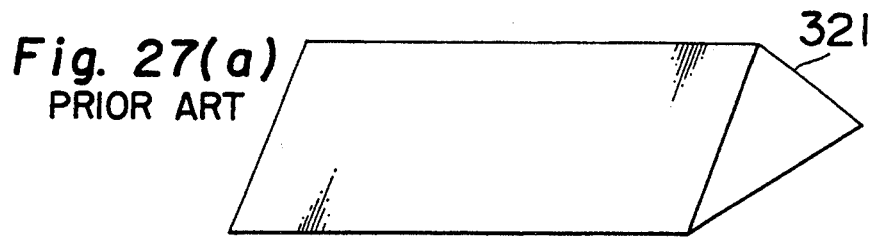
FIGS. 27(a)–27(e) show a conventional method for a producing a quantum device.
Figure 27B:
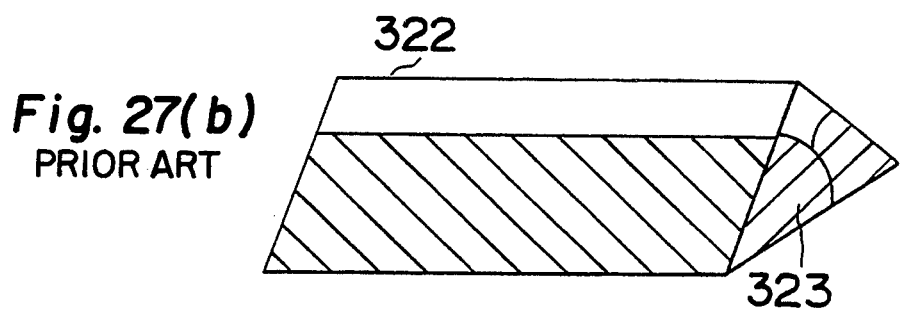
Figure 27C:
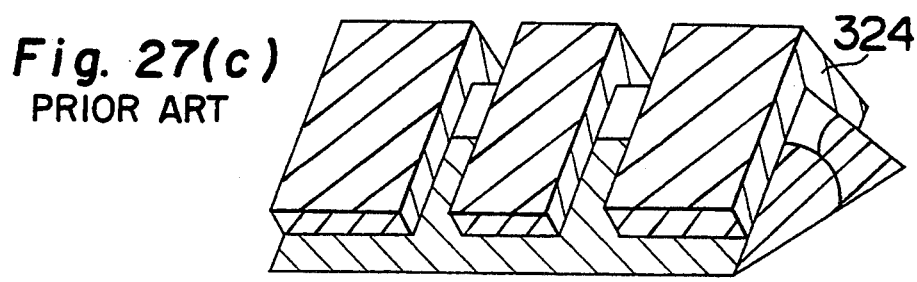
Figure 27D:
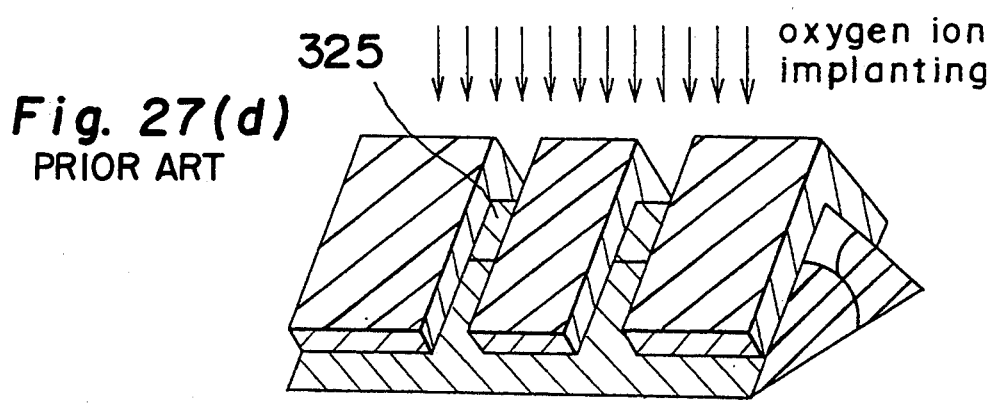
Figure 27E:
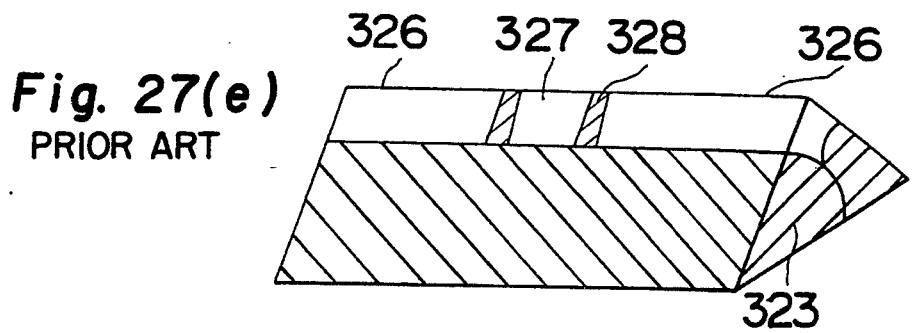

Next, the operation of the resonant electron transfer device according to this embodiment is explained. FIG. 2(a) is a sectional schematic view of this embodiment as shown in FIG. 1, wherein element 10 is a one-dimensional quantum wire on the input side; elements 11 and 21 are the zero-dimensional quantum dots; elements 12 and 22 are the one-dimensional quantum wires; elements 13, 14 and 23 are potential barriers, and elements 15 and 25 are control electrodes, comprising four constituting elements. In FIGS. 2(a) and 2(b), $\phi 1$ and $\phi 2$ are the control signals, and the time charts of these signals are also shown simultaneously. In FIG. 2(a), the one-dimensional quantum wire 10 on the input side corresponds to the diode part for the signal input of the CCD device as shown in FIG. 22 as conventional example. FIGS. 3(a) and 3(b) show a sectional schematic view of this embodiment which is the same as that of FIG. 2(a) and the change by time of the internal potential in the zero-dimensional quantum dot and one-dimensional quantum wire. The equations t=t1–t5 correspond respectively to t1–t5 of the time chart for the control signals $\phi 1$ and $\phi 2$ shown in FIG. 2(b). The resonant electron transfer device of this embodiment transfers the signal electron stored in the one-dimensional quantum wire to the output side by utilizing the resonant propagation function of the zero-dimensional quantum dot. In FIG. 2(a) and FIG. 3(a), when t=t1, the signal electron stored in the dissipated quantum level in the one-dimensional quantum wire 10 on the input side cannot flow into the adjacent next step one-dimensional quantum wire, unless a voltage is applied to the control electrode 15, because the base quantization level of the zero-dimensional quantum dot 11 connected to the one-dimensional quantum wire 10 on the input side is high. When a voltage is applied to the control electrode 15 at t=t2, the energy level of the zero-dimensional quantum dot crosses the Fermi level of the one-dimensional quantum wire 10 on the input side, so that the electron propagation occurs from the one-dimensional quantum wire 10 on the input side to the zero-dimensional quantum dot 11 by the resonant tunneling effect. At that time, since the base quantization level of the zero-dimensional quantum dot 11 is high as compared with the quantization level in the next step one-dimensional quantum wire, the signal electron is easily transferred from the zero-dimensional quantum dot 11 to the one-dimensional quantum wire of the next step. Since no voltage is applied at t=t3, the signal electron is held in the one-dimensional quantum wire of the next step. When the voltage is applied to the control electrode 25 at t=t4, in the similar principle, the signal electron is transferred from the one-dimensional quantum wire 12 to the one-dimensional quantum wire 22. By repeating this step, the signal electron can be continuously transferred in the output step direction, as in t=t5.

Here, the same operation is possible even when the one-dimensional quantum wires 12 and 22 are replaced by zero-dimensional quantum dots larger than the zero-dimensional quantum dots 11 (e.g. the length of one side is about several to several tens nanometers).

Further, with respect to the axial direction of the one-dimensional quantum wires 12 and 22, the one-dimensional quantum wire 12, zero-dimensional quantum dot 11 and the one-dimensional quantum wire 22 may be disposed on the same axis, or the parallel one-dimensional quantum wires 12 and 22 may be disposed with a zero-dimensional quantum dot 11 held therebetween.

According to this embodiment, the electron propagation between the one-dimensional quantum fine line and the zero-dimensional quantum dot is effected by the resonant tunneling effect between the quantum levels. Accordingly, in comparison with the conventional CCD devices in which the transfer of electric charge is carried out by the spreading of the decimal carriers, this system allows extremely high speed electron propagation. Also, as the energy level in the zero-dimensional quantum dot has a small dispersion, the leakage current is small and a signal propagation which is high in efficiency is possible.

In the embodiment of the present invention, an extremely thin silicon oxide film is used as a potential barrier, but an insulating film or a hetero-junction or vacuum or atmosphere may be used.

Figure 4:
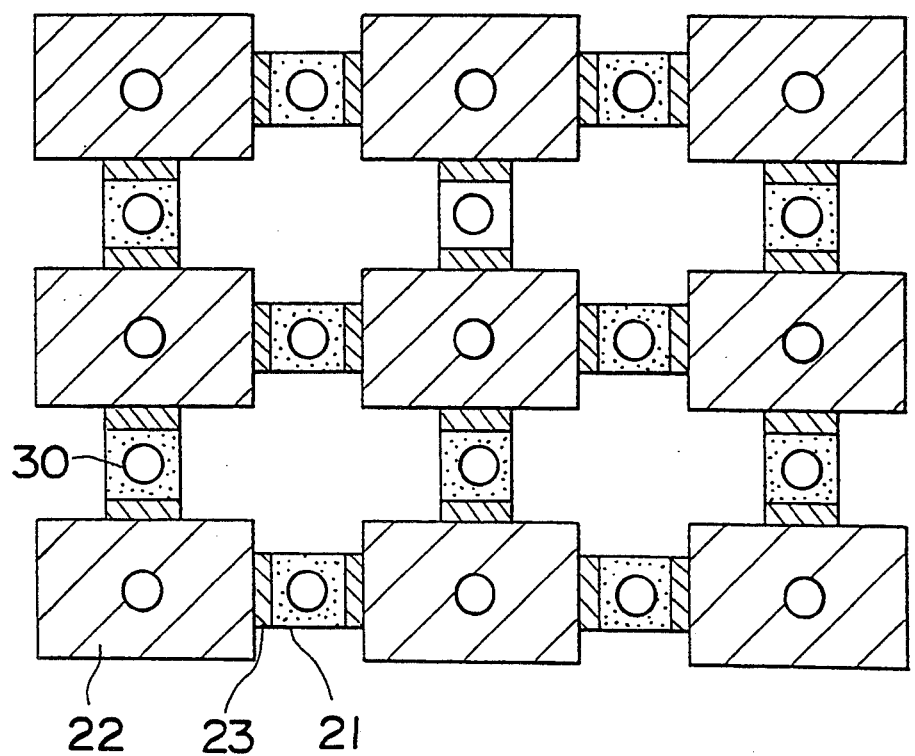
FIG. 4 is a schematic plan view of a resonant electron transfer device according to the second embodiment of the present invention.

Hereinafter, the resonant electron transfer device according to the second embodiment of the present invention is explained with reference to FIGS. 4, 5(a)-5(c) and 6(a)-6(b). FIG. 4 is an upper face view of the resonant electron transfer device according to the second embodiment of the present invention, wherein 21 denotes a zero-dimensional quantum dot; element 22 is a one-dimensional quantum wire; element 23 is a potential barrier, and element 30 is an electrode. The zero-dimensional quantum dot 21 and one-dimensional quantum wire 22 are connected to each other with the potential barrier 23 (e.g. an extremely thin oxide film of about 5 nm in thickness) therebetween. With by these parts taken as a constitution element, a plurality of constitution elements are two-dimensionally connected in the network form. In FIG. 5, nine constitution elements form a network. Also, each zero-dimensional quantum dot and one-dimensional quantum wire have electrodes 30 for controlling the internal potential thereof.

Next, the operation of the resonant electron transfer device according to this embodiment of the present invention is explained. FIG. 5(a) is a sectional schematic view of a part of this embodiment, wherein elements 21 and 31 are the zero-dimensional quantum dots; elements 22 and 32 are the one-dimensional quantum wires; element 30 is an electrode for controlling the internal potential, and $\phi 1$, $\phi 2$ and $\phi 3$ are control signals. In FIGS. 5(a)-5(c), there are also shown the changes by time of the internal potentials of the one-dimensional quantum wires 22 and 32 and the zero-dimensional quantum dot 21 when the control signals $\phi 1$-$\phi 3$ of the electrode 30 are changed. In FIG. 5(a), the signal electron is stored in the one-dimensional quantum wire 22 in the initial state, and the control signals are assumed to be $\phi 1$=LOW, $\phi 2$=LOW, and $\phi 3$=LOW, respectively. As shown in FIG. 5(a), because the base quantization level in the zero-dimensional quantum dot 21 is higher than those in the one-dimensional quantum wires 22 and 32, the signal electron stored in the one-dimensional quantum wire 22 remains unchanged in the initial state.

Next, when the arrangement is set such that $\phi 1$=LOW, $\phi 2$=HIGH, and $\phi 3$=HIGH, because the quantum level in the zero-dimensional quantum dot 21 crosses the Fermi level of the one-dimensional quantum wire 22, the signal electron passes through the potential barrier 23 by the resonant tunneling effect, and as a result electron propagation occurs on the next step one-dimensional quantum wire 22 as shown in FIG. 5(b).

Figure 6A:
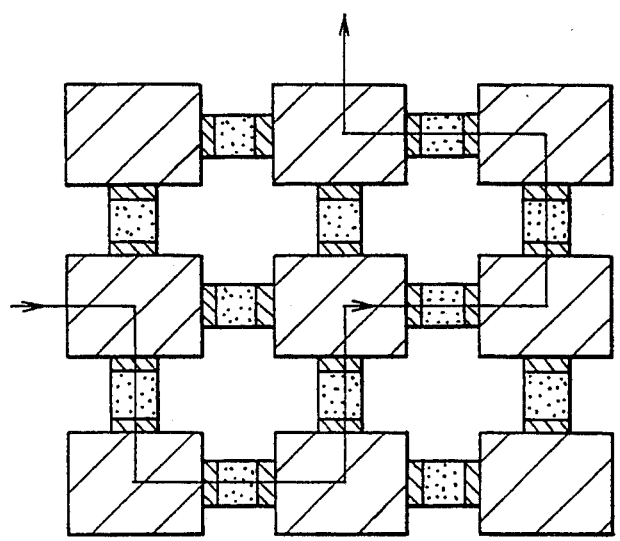
FIG. 6(a) and 6(b) are views showing the signal transfer channel of the resonant electron transfer device according to the second embodiment of the present invention.
Figure 6B:
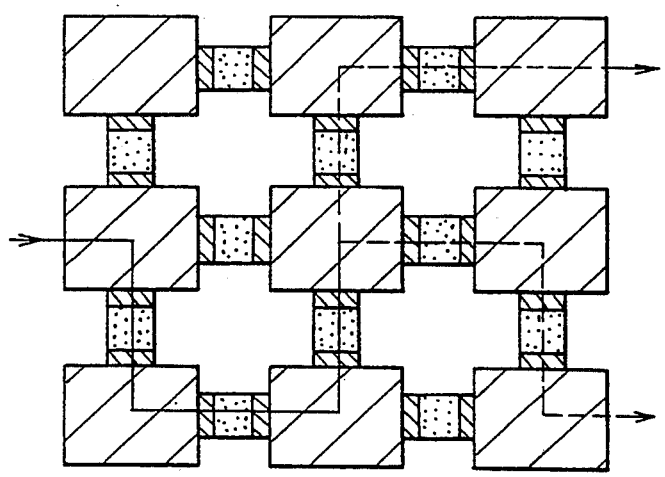

On the other hand, when the conditions are set such that $\phi 1$=LOW, $\phi 2$=HIGH, and further an appropriate positive bias $\delta$ is applied to $\phi 3$, then, as shown in FIG. 5(c), electron propagation occurs until the Fermi level of the one-dimensional quantum wire 32 on the output step and the base quantization level of the zero-dimensional quantum dot 21 are equal. Accordingly, when plural zero-dimensional quantum dots and one-dimensional quantum wires are connected to one one-dimensional quantum wire as in FIG. 4, it becomes possible to propagate the signal electron by branching in plural directions by selecting an appropriate positive bias $\delta$. In this case, the sum of the branched signal electrons is naturally equal to the sum of the signal electrons before branching. As above, when the applied voltages of the control electrodes are varied in order in the direction of the propagation of the electrons, the electrons can be propagated in an optional direction in the two-dimensional network as shown in FIG. 6(a). Further, as shown in FIG. 6(b), the signal may be branched to propagate the electrons in an optional direction in the two-dimensional network. Here, the upper surface views of FIGS. 6(a)-6(b) are equal to that of FIG. 4. According to this embodiment, because the electron propagation between the zero-dimensional quantum dot and the one-dimensional quantum wire is based on the tunneling effect between the quantum levels, extremely high speed electron signal propagation is possible. Further, since the energy dispersion in the zero-dimensional quantum dot is in a delta function form and has a small dispersion, the leakage current is small, and an extremely high efficiency electron transfer can be realized in the optional direction in the two-dimensional network.

Here, the same operation is possible when the one-dimensional quantum wires 22 and 32 are replaced by the zero-dimensional quantum dots which are larger than the zero-dimensional quantum dot 21 (e.g. the length of one side is about several to several tens of nanometers).

Further, the one-dimensional quantum wires 22 and 32 and zero-dimensional quantum dot 11 may be disposed on the same plane, or the one-dimensional quantum wires 22 and 32 may be disposed in parallel with a zero-dimensional quantum dot 11 held therebetween.

Figure 7:
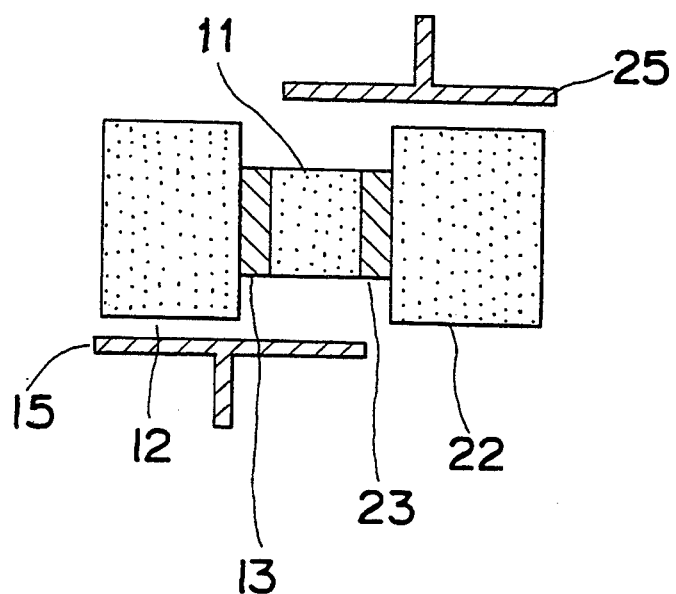
FIG. 7 shows a constitution of the resonant electron transfer device according to a third embodiment of the present invention.

Next, the third embodiment of the present invention is explained with reference to FIGS. 7 and 8(a)-8(c). FIG. 7 is a constitution view of the resonant electron transfer device according to the third embodiment of the present invention. The numeral 11 denotes a quantum dot; element 12 is a first quantum wire; element 22 is a second quantum wire, and elements 15 and 25 are the control electrodes. The quantum dot 11 and quantum wires 12 and 22 are connected with one another with the potential barriers 13 and 23 (e.g. extremely thin silicon oxide film of no more than 5 nm in thickness) therebetween. The internal potentials of the first quantum wire 12 and the quantum dot 11 are controlled by the control electrode 15. Also, the internal potentials of the second quantum wire 12 and the quantum dot 11 are controlled by the control electrode 25.

Figure 8A:
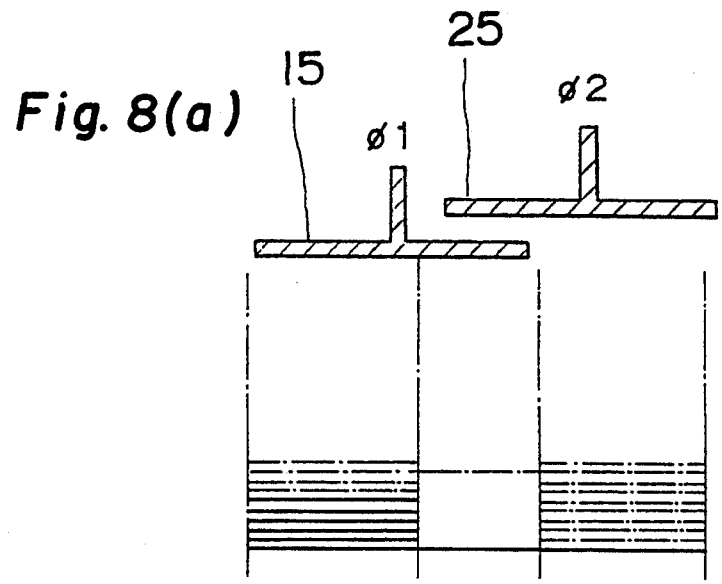
FIGS. 8(a)–8(c) are explanatory views showing the operation of the resonant electron transfer device according to the third embodiment of the present invention.
Figure 8B:
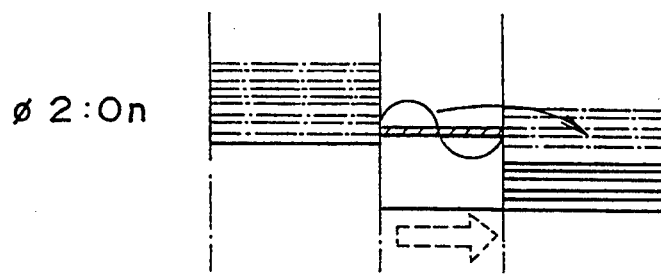
Figure 8C:
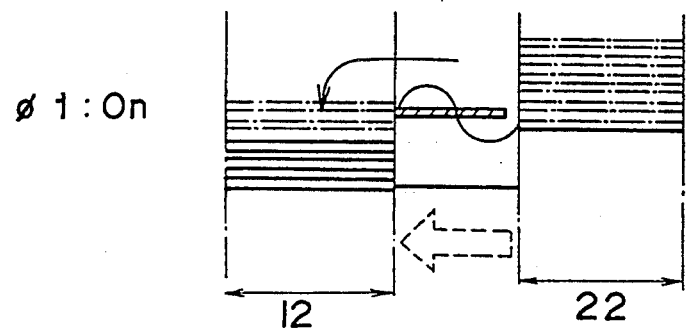

Next, the operation of the resonant electron transfer device according to this embodiment is explained. FIGS. 8(a)-8(c) are views showing the changes by time of the internal potentials of the quantum dot and one-dimensional quantum wires of the resonant electron transfer device of the present invention as shown in FIG. 7. The resonant electron transfer device of the present embodiment transfers the signal electrons stored in the quantum wire in the figure to the adjacent quantum wire by utilizing the resonant propagation function of the quantum dot. In FIG. 8(a), because the base quantum levels of the signal electron A stored in the dissipated quantum level in the quantum wire 12 and the quantum dot 11 combined with the quantum wire 12 are high, unless a voltage is applied to the control electrode 25, no influx into the adjacent quantum wire 22 can occur. As shown in FIG. 8(b), when the voltage is applied to the control electrode 25, because the energy level of the quantum dot 11 crosses the Fermi level of the quantum wire 12, electron propagation occurs from the quantum wire 12 to the quantum dot 11 by the resonant tunneling effect. At such time, since the base quantization level of the quantum dot 12 is high in comparison with the quantization level in the quantum wire 22, the signal electron is easily propagated from the quantum dot 11 to the quantum wire 22. Under this state, when, as shown in FIG. 8(c), a voltage is applied to the control electrode 25, the signal electron is propagated to the quantum wire 12. By repeating this sequence, reciprocal transfer of signal electrons becomes possible.

Figure 9:
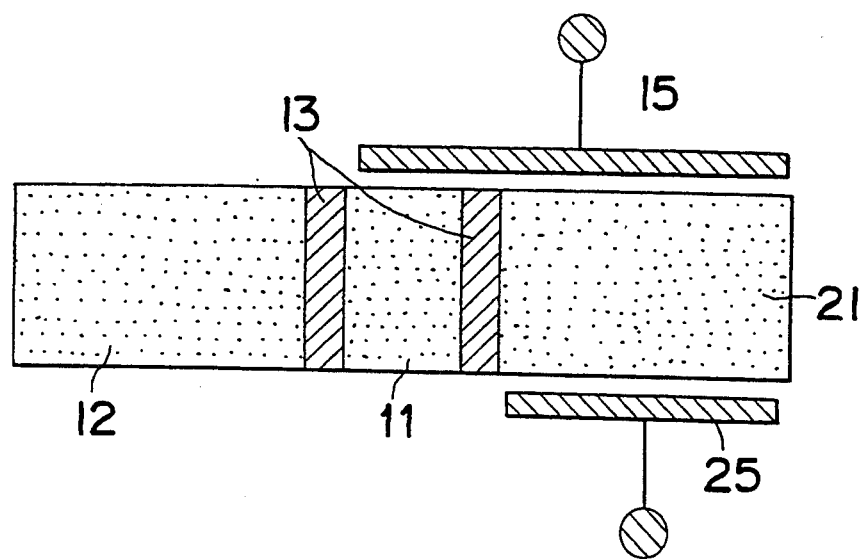
FIG. 9 is a schematic sectional view showing a constitution of the resonant electron transfer device according to a fourth embodiment of the present invention.

Next, referring to FIGS. 9 and 10(a)–10(d), the fourth embodiment of the present invention is explained. FIG. 9 is a constitutional view of the resonant electron transfer device according to the fourth embodiment of the present invention. In FIG. 9, element 12 is a quantum wire; element 13 is a potential barrier; element 11 is a quantum dot; element 21 is a quantum dot; element 15 is a first control electrode, and element 25 is a second control electrode. The area above the quantum dot 11 is smaller in size than that of the quantum dot 21, and has a high base quantization level. With respect to the device constituted as above, the structure thereof is explained below.

In FIG. 9, the quantum wire 12 is formed, for example, of a Si crystal having a width of no larger than 20 nm, and is connected to other quantum devices, or the like. The quantum dot 11 and quantum dot 21 are combined with the quantum wire 12 with a potential barrier 13 therebetween. The length of a side of the quantum dot 11 is about 5 nm, and the length of a side of the quantum dot 21 is about 20 nm. The thickness of the potential barrier 13 is about 3 nm. The first control electrode 15 is connected to the quantum dot 11 and the quantum dot 21 with an insulation film therebetween, and the second control electrode 25 is connected to the quantum dot 21 with an insulation film therebetween.

Figure 10A:
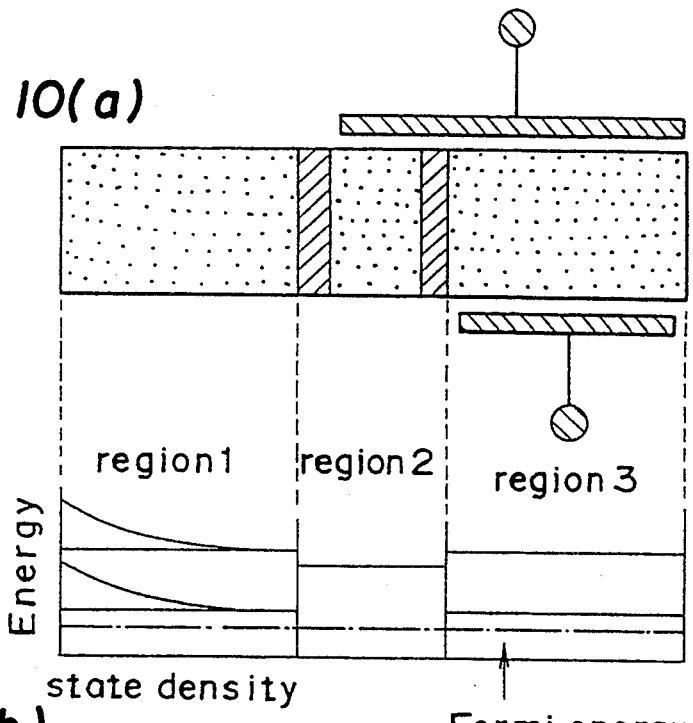
FIGS. 10(a)–10(d) are explanatory views showing the operation of the resonant electron transfer device according to the fourth embodiment of the present invention.
Figure 10B:
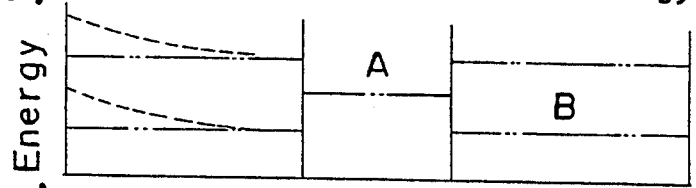
Figure 10C:
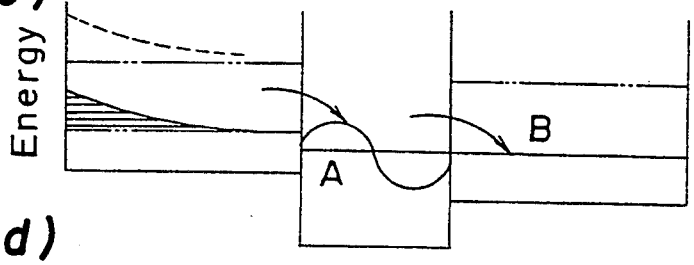
Figure 10D:
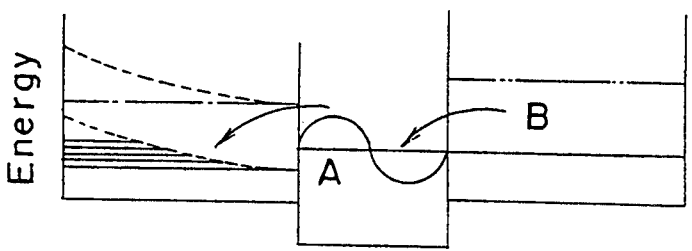

FIGS. 10(a)–10(d) are explanatory views of the operation mechanism of the device according to the fourth embodiment of the present invention. Based on the constitution view of the device shown in FIG. 9, the operation thereof is explained below. FIG. 10(a) shows the condition density function of electron in each region. FIGS. 10(b), 10(c) and 10(d) are the views showing the occupation states of the energy levels in the respective regions, in which the dashed line shows the unoccupied condition, and the solid line shows the occupied condition.

In the device shown in FIG. 9, both the first control electrode 15 and the second control electrode 25 are set to be of such a shape and size as to have the band structures as shown in FIG. 10(a), when no potential is applied. In this case, the wire portion as shown in the region 1 is formed into one-dimension, and accordingly has the condition density as shown in FIG. 10(a). In the quantum dot as shown in the region 2, the electron is confined in the zero-dimensional space, and the condition density becomes dissipating as shown in FIG. 10(a). In the quantum wire region as shown in the region 3, the density distribution becomes such state as to be dissipating and has spread over the high energy side. By combining these 1, 2 and 3, i.e. dot quantum wire, quantum dot, and quantum dot, the respective Fermi levels agree. In this case, the appropriate potential applied to each region so as to make the energy condition is as shown in FIG. 10(b). At such time, the levels A and B may be different or be of the same energy, as shown in FIG. 10(b). This is in a waiting state when considered as a memory device.

Next, when an appropriate bias is applied to the first control electrode 15 and the second control electrode 25, and as shown in FIG. 10(c), the levels A and B in the regions 2 and 3 are allowed to agree and are set to be lower than the Fermi level in the region 1, the electrons having the energy same as the levels A and B in the region 1 pass through the quantum dot 11 by the resonant tunnel effect, and gradually fill the level B in the region 3. This becomes the writing of information into the quantum dot 21, corresponding to the writing operation of the memory device.

Next, the information reading out operation is explained. As shown in FIG. 10(d), when an appropriate bias is applied to the first control electrode 15 and the second control electrode, the levels A and B in the regions 2 and 3 are caused to agree, and are raised so as to be higher than the Fermi level in the region 1, and the electrons occupying the level B in the region 3 pass through the level A in the region 2 and are transferred to the level C in the region 1. This operation corresponds to the reading out of information of the quantum dot 21.

Here, the same operation is possible even when the one-dimensional quantum wires 12 and 22 are replaced by zero-dimensional quantum dots which are larger than the zero-dimensional quantum dots 21 (e.g. the length of one side is about several to several tens of nanometers). In this embodiment, by combining the quantum dots, and controlling the internal potential by the first and second control electrodes, writing-in and reading-out of electron signals to the quantum dot become possible, and a memory function can be realized.

Further, the one-dimensional quantum wires 12 and 22, and the zero-dimensional quantum dot 11 may be disposed on the same plane, or the one-dimensional quantum wires 22 and 32 may be disposed in parallel, with a zero-dimensional quantum dot 11 held therebetween.

Figure 11:
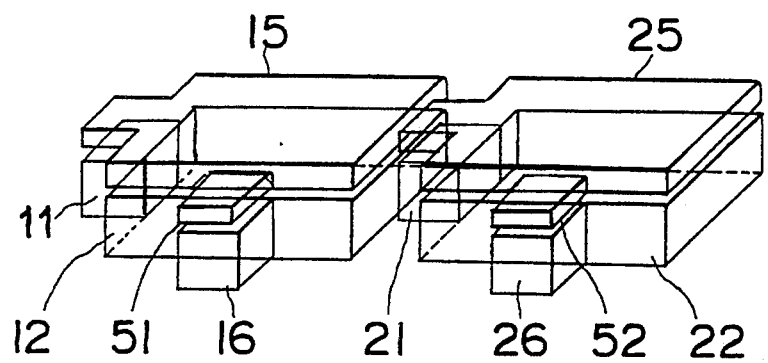
FIG. 11 is a perspective view of the resonant electron transfer device according to a fifth embodiment of the present invention.

Next, the fifth embodiment of the present invention is explained with reference to FIGS. 11, 12(a)–12(c), 13(a)–(b) and 14(a)–14(b). FIG. 11 is a perspective view of the resonant electron transfer device according to the fifth embodiment of the present invention, wherein elements 11 and 21 denote zero-dimensional quantum dots; elements 12 and 22 are one-dimensional quantum wires; elements 16 and 26 are quantum well memories; elements 15 and 25 are first control electrodes, and elements 51 and 52 are second control electrodes. The zero-dimensional quantum dot 11 and one-dimensional quantum wire 12 form a pair, and have the first control electrode 15 for controlling the common internal potential. Also, the quantum well memory 16 has the second control electrode 51 for controlling the internal potential. A zero-dimensional quantum dot 11, one-dimensional quantum wire 12, and quantum well memory 16 form a one constitution element, and in FIG. 11 there is shown an example in which the two constitution elements are connected in series. Though not shown in FIG. 11, the zero-dimensional quantum dot, one-dimensional quantum wire and quantum well memory are connected to one another with potential barriers therebetween of a degree through which the electrons can pass by a tunneling effect (e.g. an extremely thin silicon oxide film of no more than 5 nm).

Figure 12A:
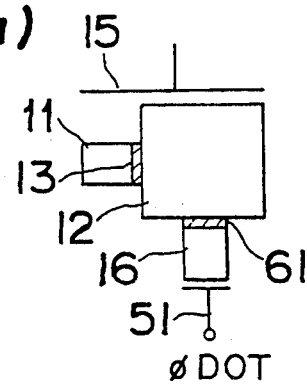
FIGS. 12(a)–12(c) are schematic sectional views of a constitutional element of the resonant electron transfer device according to the fifth embodiment of the present invention.
Figure 12B:
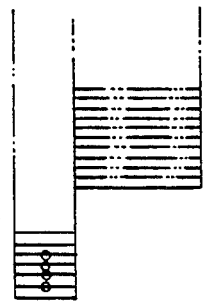
Figure 12C:
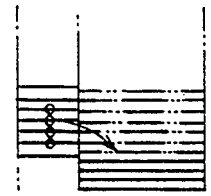
Figure 13A:
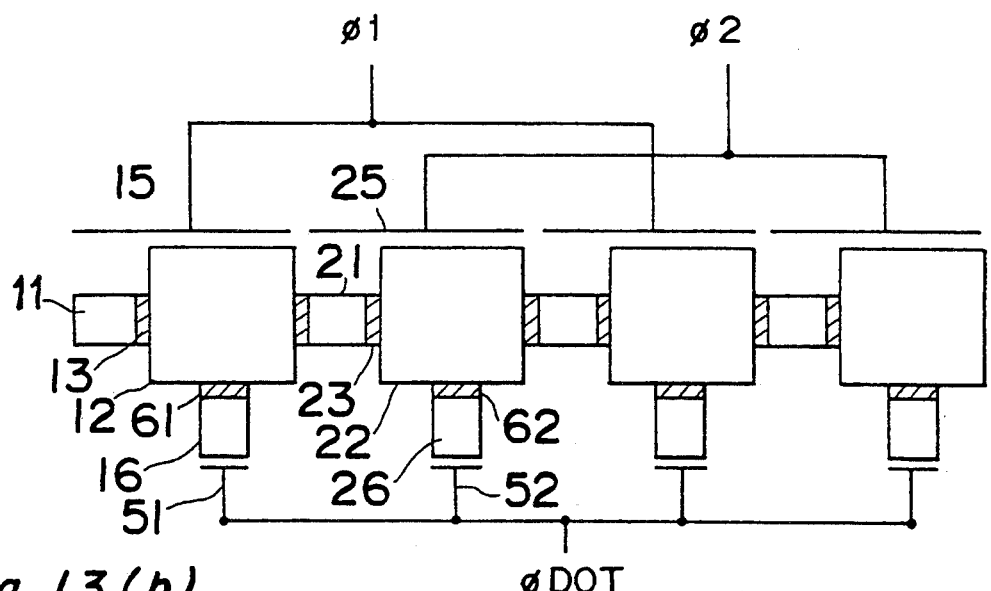
FIG. 13(a) is a schematic sectional view of the 4 constitutional elements of the resonant electron transfer device according to the fifth embodiment of the present invention when connected in series.
Figure 13B:
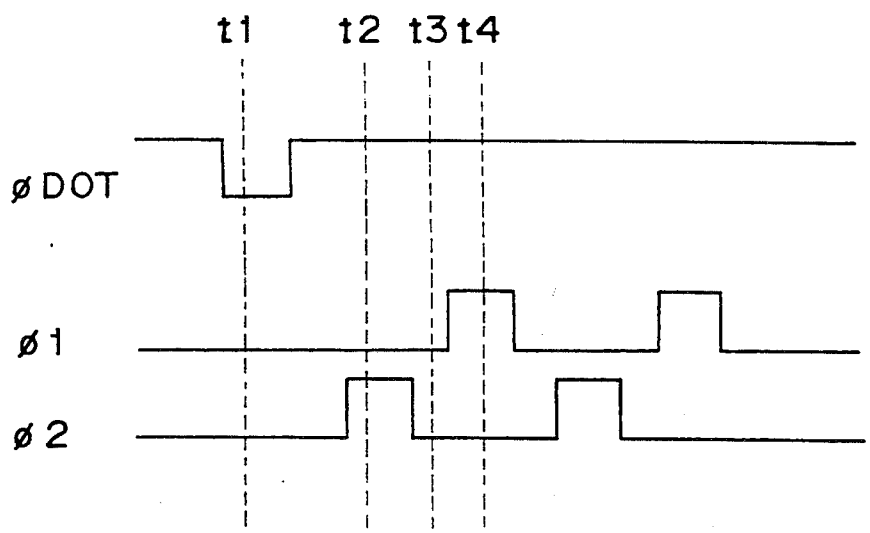
FIG. 13(b) is a time chart of control signals shown in FIG. 13(a)
Figure 14:
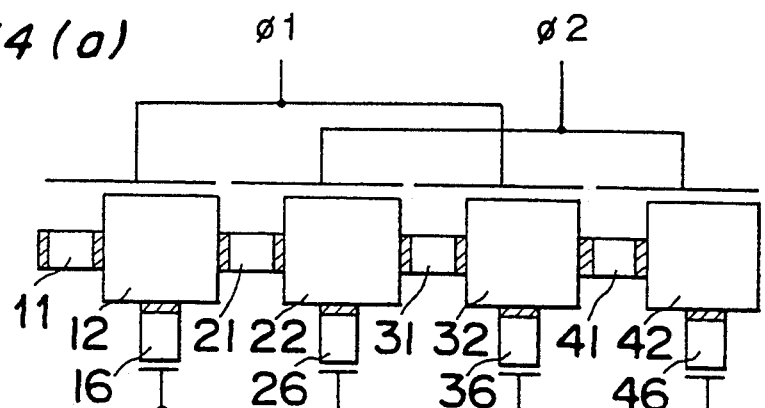
FIG. 14(a) is a schematic sectional view which is the same as FIG. 13(a) and 14(b) is a view showing the change by time of the internal potentials of the one-dimensional quantum wire and the zero-dimensional quantum dot, which are the constituting elements of the resonant electron transfer device according to the fifth embodiment of the present invention.
Figure 14:
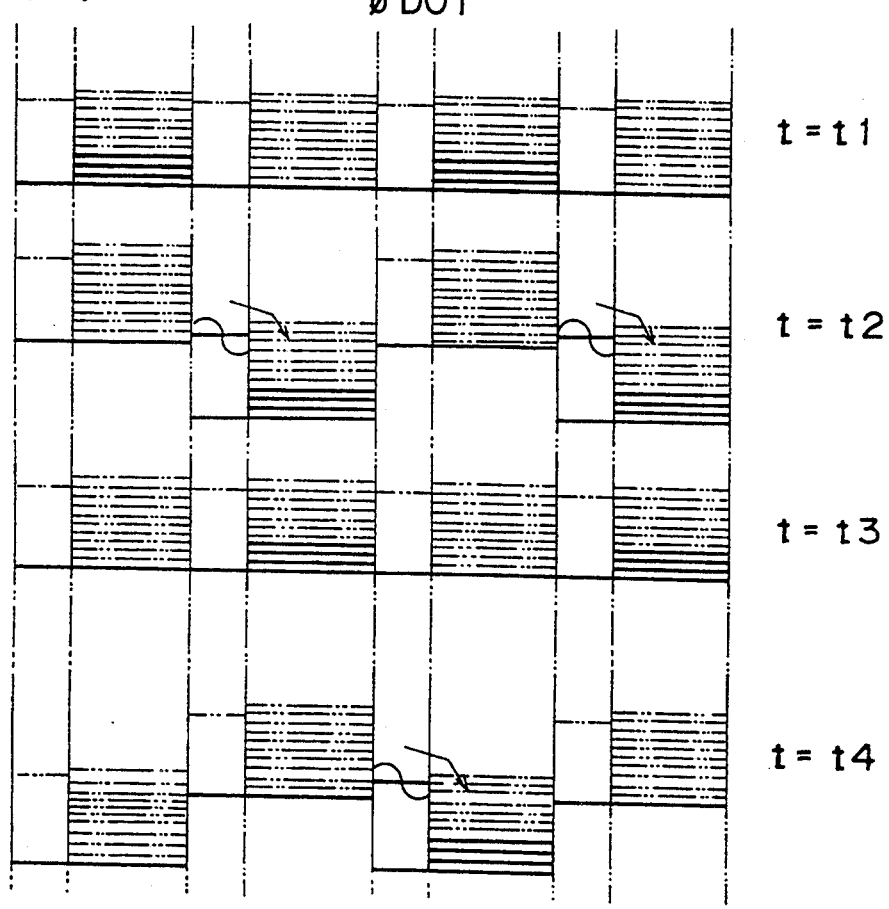

Next, the operation of the resonant electron transfer device of this embodiment is explained. FIG. 12(a) is a schematic view of the section of a constitution element of this embodiment, in which element 11 is the zero-dimensional quantum dot; element 12 is a one-dimensional quantum wire; elements 13 and 61 are potential barriers; element 16 is a quantum well memory; element 15 is a first control electrode, and element 51 is a second control electrode. With respect to the drawing numbers in FIG. 12(a), the parts which are same as those shown in FIG. 11 are shown by the same numbers. $\phi$DOT is a signal for reading out and writing in of the data. The band diagram shown in FIGS. 12(b)-12(c) shows the condition in which the quantum well memory 16 and the one-dimensional quantum wire 12 are connected. Under the initial state, the information "1" is inputted in the quantum well memory 16. As the quantum level in the quantum well memory 16 has a higher base level than the one-dimensional quantum wire 12, in the case of $\phi$DOT=HIGH, the signal electron in the quantum well memory 16 cannot be propagated in the one-dimensional quantum wire 12, and the information remains a "1". However, in the case of $\phi$DOT=LOW, the signal electron is propagated to the one-dimensional quantum wire 12 by the resonant tunneling effect. In this manner, it is possible to write in or read out the information in the quantum well memory 16 to the one-dimensional quantum wire 12. FIGS. 13(a)-13(b) and 14(a)-14(b) are views used to illustrate the data transfer principles after reading in the information in the quantum well memory. FIG. 13(a) is a sectional schematic view of the 4 constitution elements of this embodiment connected in series. In the figure, the numerals are the same as those used in FIGS. 11 and 12(a). Furthermore, $\phi$1 and $\phi$2 are the control signals to be applied to the first control electrodes 15 and 25, and $\phi$DOT is a reading out and writing in signal to be applied to the second control electrodes 51 and 52. In FIG. 13(b), the time charts of 41, 42, and $\phi$DOT are simultaneously shown. FIGS. 14(a)-14(b) are a sectional schematic view similar to that of FIG. 13(a) and the changes by time of the internal potentials of the one-dimensional quantum wires 12, 22, 32 and 42 at $t=t1-t4$ time shown in FIG. 13(a), and zero-dimensional quantum dots 11, 21, 31 and 41. It is assumed that in the initial state the information "1", "0", "1", "0" is written in the quantum well memories 16, 26, 36 and 46, respectively.

In FIGS. 13(a)-13(b) and 14(a)-14(b), firstly, when $t=t1$, the state is $\phi$DOT=LOW, and the information in the quantum well memories 16, 26, 36 and 46 is read out into the one-dimensional quantum wires 12, 22, 32 and 42, respectively using the principles as previously explained. When, at $t=t2$, $\phi$2 becomes HIGH, the energy levels of the next step zero-dimensional quantum dots 21, 31 and 41 cross the Fermi level in the one-dimensional quantum wires 12, 22 and 32, and therefore signal propagations occur from the one-dimensional quantum wires 12, 22 and 32 to the zero-dimensional quantum dots 21, 31 and 41, respectively, by the resonant tunneling effect. In that case, as the base quantization levels in the zero-dimensional quantum dots 21, 31 and 41 are high in comparison with the quantization levels in the one-dimensional quantum wires 12, 22 and 32, the signal electrons are easily transferred to the next step one-dimensional wires 22, 32 and 42, respectively. At $t=t3$, the signal electrons remain held in the one-dimensional quantum wires 22, 32 and 42. At $t=t4$, according to the similar principle, the signal electrons in the one-dimensional quantum wires 22, 32 and 42 are transferred to the next step one-dimensional quantum wires 32 and 42. It is known that, by repeating these steps, the information in the initially read quantum well memories 16, 36 and 46 can be transferred to the direction of the output step. It is also possible to transfer the information from the one-dimensional quantum wire to the quantum well memories as $\phi$DOT=HIGH.

According to this embodiment, the principles of reading-out and writing-in of data to the memory and the data transfer are all based on the resonant tunneling effect, so that the circuit operation is of an extremely high speed. Furthermore, the dissipated energy levels in the quantum well memory 16 are of a delta function form and low dispersal, so that the leakage current is small, and accordingly a memory cell which has an ultra-low power consumption can be realized.

In the embodiments of the present invention, extremely thin silicon oxide films are used as the potential barriers. However, an insulating film or a hetero-junction or vacuum or atmosphere may be used. Further, although the one constitution element of the resonant electron transfer device of the present invention is connected in series in the embodiment, the connection may be made by more than two rows in parallel.

Next, a method for producing the resonant electron transfer device according to another embodiment of the present invention is explained with reference to the drawings.

Figure 15A:
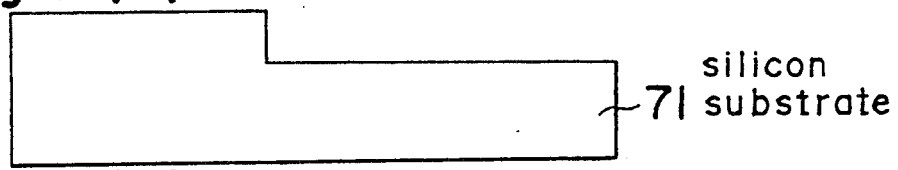
FIGS. 15(a)–15(g) show a method for producing the resonant electron transfer device according to a sixth embodiment of the present invention.
Figure 15B:
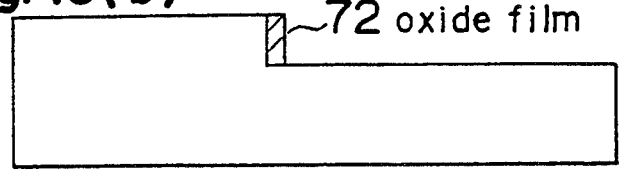
Figure 15C:
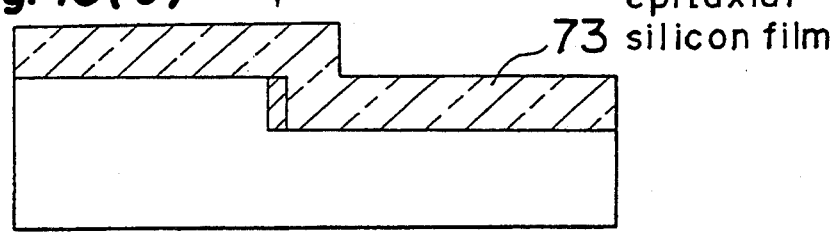
Figure 15D:
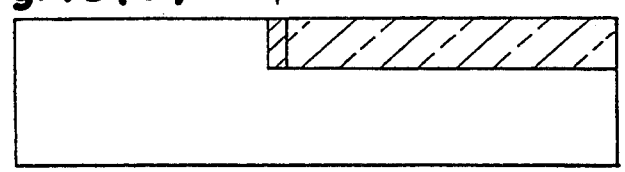
Figure 15E:
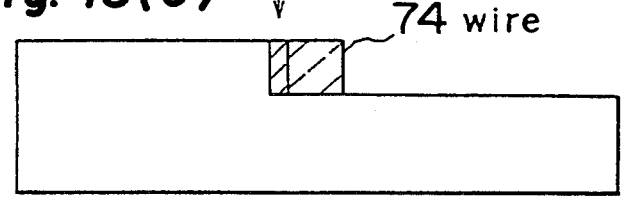
Figure 15F:
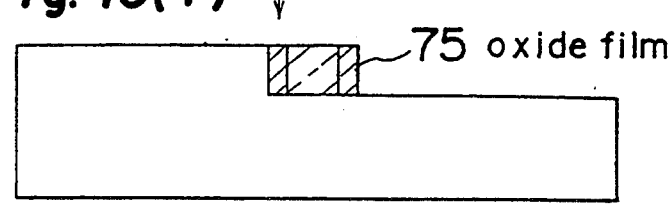
Figure 15G:
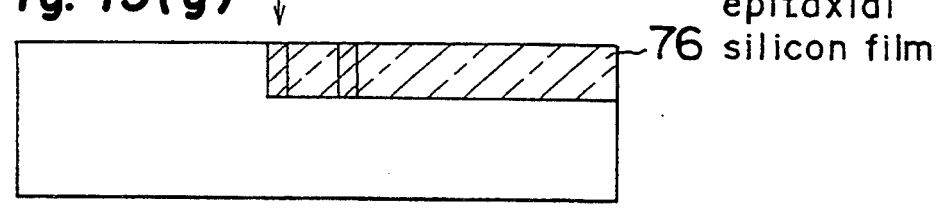
Figure 16H:
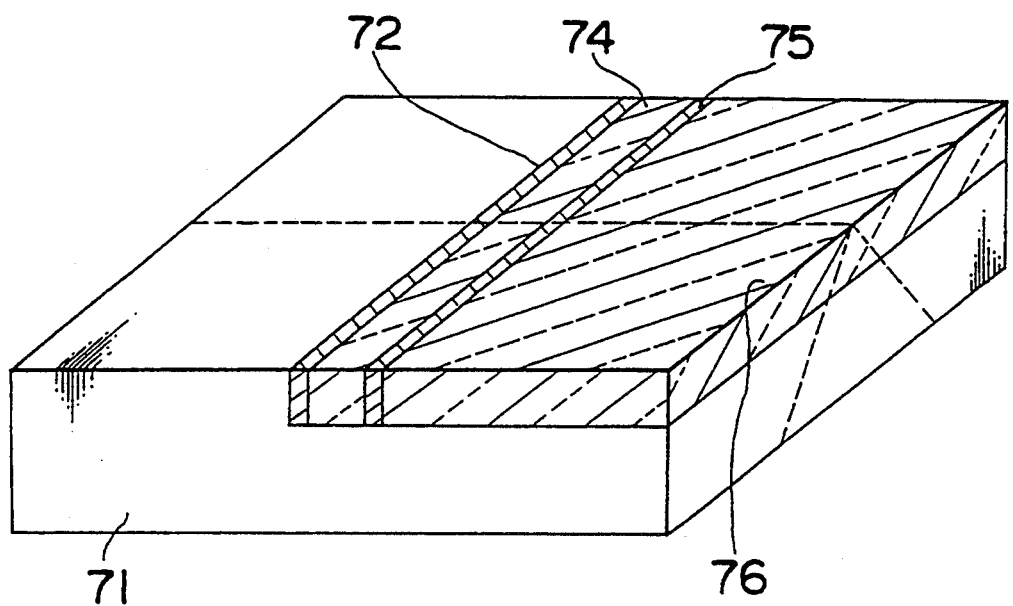
FIGS. 16(h)–16(i) show the remaining steps of the method for producing the resonant electron transfer device according to the sixth embodiment of the present invention.
Figure 16I:
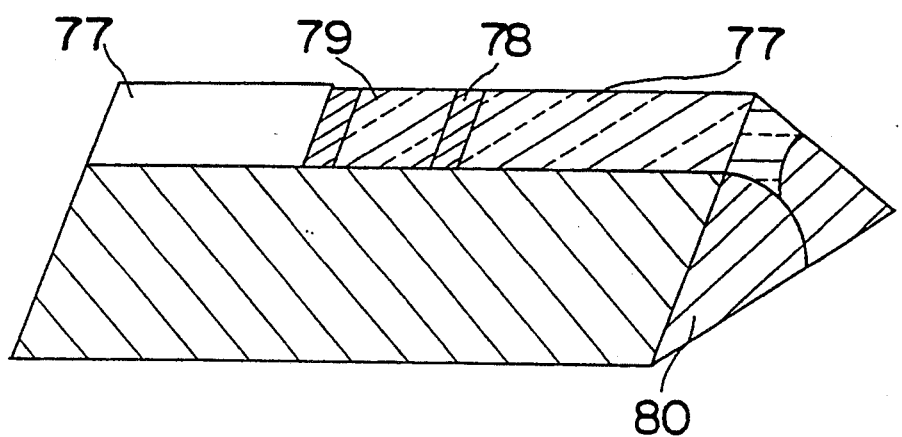

Next, using FIG. 15(a)-15(g) and FIG. 16(h)-16(i), the sixth embodiment of the present invention is explained. FIGS. 15(a)-15(g) and 16(h)-16(i) show the method for producing the quantum device according to the sixth embodiment of the present invention. In FIGS. 15(a)-15(g) which denote the cross-sectional views of the substrate, element 71 is a silicon substrate; element 72 is an oxide film; element 73 is an epitaxial silicon film; element 74 is a wire; element 75 is an oxide film, and element 76 is an epitaxial silicon film. In FIGS. 16(h)-16(i), element 75 is an oxide film; element 74 is a wire; element 76 is an epitaxial silicon film; element 77 is a quantum wire; element 78 is a tunnel oxide film; element 79 is a quantum dot, and element 80 is a separated oxide.

With respect to the method for producing the resonant electron transfer device constituted as above, the manufacturing flow thereof is explained hereinafter.

In FIG. 15(a), the silicon substrate 71 is provided with stepwise processing to a height of about several nanometers. In FIG. 15(b), an oxide film 72 of about 3 nanometers in thickness is formed on only the above stepwise lateral wall portion. In FIG. 15(c), piling up of the epitaxial silicon film 73 to a thickness of about several nanometers is carried out. In FIG. 15(d), etching of the epitaxial silicon film 73 is performed, and the epitaxial silicon film 73 is left only on the recess of the silicon substrate 71. In FIG. 15(e), etching of the epitaxial silicon film 73 is performed, and the epitaxial silicon film 73 is left only in the vicinity of the oxide film 72 to form a wire 74 of about several nanometers in width. In FIG. 15(f), an oxide film 75 of about 3 nanometers in thickness is formed only on the lateral side of the wire 74. In FIG. 15(g), piling up and flattening of the epitaxial silicon film 76 of about several nanometers in thickness is carried out. FIG. 16(h) is a view of this state observed from oblique upper part. In FIG. 16(i), anisotropic etching is carried out in a dashed line shape in FIG. 16(h) to form a ridge line shape, after which a separation oxide film 80 is formed. As a result, the wire 74 becomes a quantum dot 79 having a width of a side of about several nanometers, the epitaxial silicon film 76 becomes a quantum wire 77, and the oxide films 72 and 75 become a tunnel oxide film 78. Accordingly, it is possible to prepare a structure in which the quantum wire 77/quantum dot 79/quantum wire 77 are coaxially combined in series with the tunnel oxide film 78 therebetween.

In the present embodiment, the preparation of a tunnel oxide film by thermal oxidation of the silicon crystal or by piling up the oxide films is possible, so that the control of the tunnel oxide film thickness is easy, and miniaturization is also easy.

As described above, according to this embodiment, preparation of a resonant electron transfer device in which one-dimensional quantum wire, zero-dimensional quantum dot, and one-dimensional quantum wire are coaxially disposed becomes possible.

Next, using FIGS. 17(a)-17(f) and FIGS. 18(g)-18(k), the seventh embodiment of the present invention is explained. FIGS. 17(a)-17(f) and 18(g)-18(k) show a method for producing the resonant electron transfer device according to the seventh embodiment of the present invention. In FIGS. 17(a)-17(f), element 81 is a silicon substrate; element 82 is a resist; element 83 is a silicon nitride film; element 84 is a side wall, and element 85 is a silicon oxide film. In FIGS. 18(g)-18(k), element 86 is an epitaxially grown silicon; element 87 is an oxide film; element 88 is a polysilicon layer, element 89 is a laser beam, and element 90 is a monocrystalline silicon element.

With respect to the method for producing the quantum device constituted as above, the manufacturing flow thereof is explained in the following.

Figure 17A:
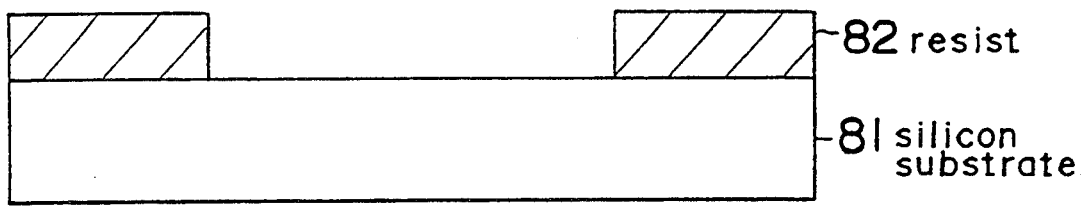
FIGS. 17(a)–17(f) show a method for producing the resonant electron transfer device according to a seventh embodiment of the present invention.
Figure 17B:
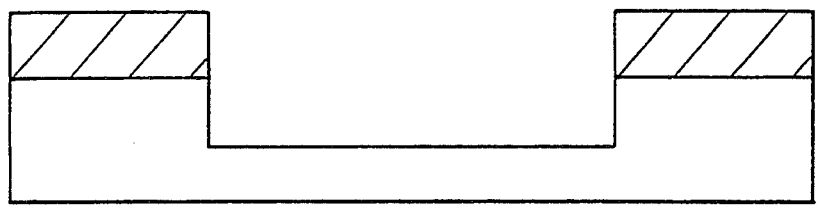
Figure 17C:
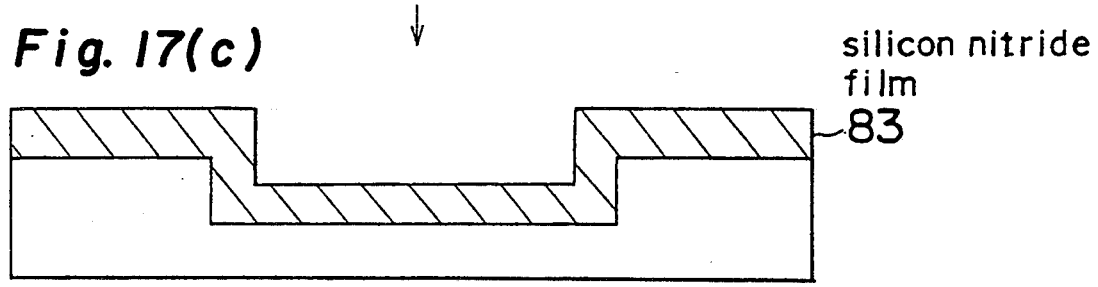
Figure 17D:
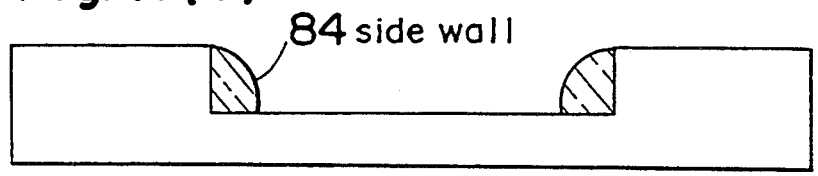
Figure 17E:
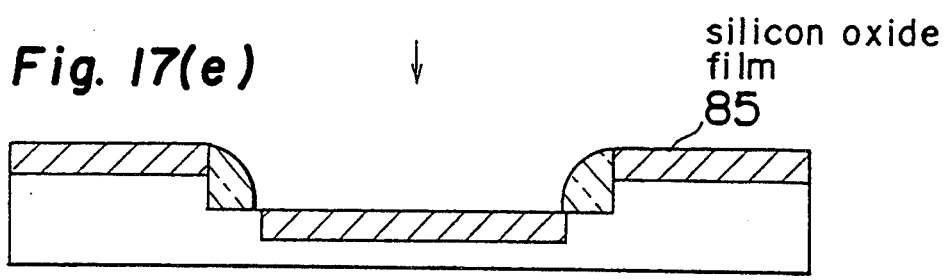
Figure 17F:
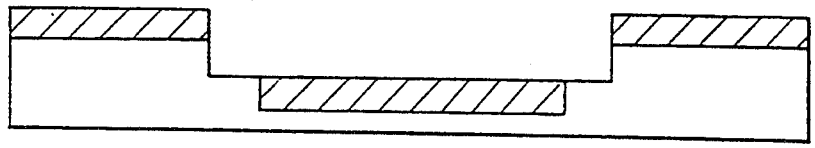

In FIG. 17(a), on a silicon substrate 71 a rectangular resist pattern 72 having a length of 2-3 microns and a width of about 1 micron is formed. In FIG. 17(b), etching of the silicon substrate of several nanometers is carried out to form a groove of specified shape. In FIG. 17(c), the resist pattern 72 is removed, after which the silicon nitride film 83 is piled up. In FIG. 17(d), anisotropic etching is carried out by dry etching to form a side wall 84 only on the peripheral part of the groove. In FIG. 17(e), thermal oxidation is carried out to cover the silicon surface other than the side wall 84 with a silicon oxide film 85. In FIG. 17(f), the side wall 84 is removed, and the silicon monocrystal surface is exposed. In FIG. 18(g), epitaxial growth of silicon crystal is carried out from the exposed surface to form an epitaxially grown silicon 86. In FIG. 18(h), an oxide film 87 is formed on the epitaxially grown silicon 86 by thermal oxidation. In FIG. 18(i), a polysilicon 88 is piled up. In FIG. 18(j), a polysilicon layer 88 is processed into a specified shape. In FIG. 18(h), the polysilicon layer 88 is re-crystallized by the laser beam 89 to obtain a monocrystalline silicon element 90.

Subsequently, by the method shown in FIGS. 16(h)-16(i), there is formed a device comprising as constituting elements a quantum wire formed of an epitaxially grown silicon 86 and a quantum dot formed of a monocrystalline silicon 90.

In the present embodiment, control of the width of the monocrystalline silicon 90 which is to be used as a quantum dot is determined by the epitaxially grown silicon 86. Accordingly, control is possible depending on the conditions of epitaxial growth, and precision control and micronization are easy.

Next, using FIGS. 19(a)-19(f) and FIGS. 20(a)-20(d), an eighth embodiment of the present invention is explained with reference to the drawings.

FIGS. 19(a)-19(f) show a method for producing the resonant electron transfer device in accordance with an embodiment of the present invention. In FIGS. 19(a)-19(f), element 101 is a silicon substrate; element 102 is a silicon oxide film; element 103 is a quantum wire; element 104 is a silicon oxide film; element 105 is a polycrystal silicon, and element 106 is a quantum dot. With respect to the method for producing the resonant electron transfer device constituted as above, the production flow thereof is explained below.

Figure 19A:
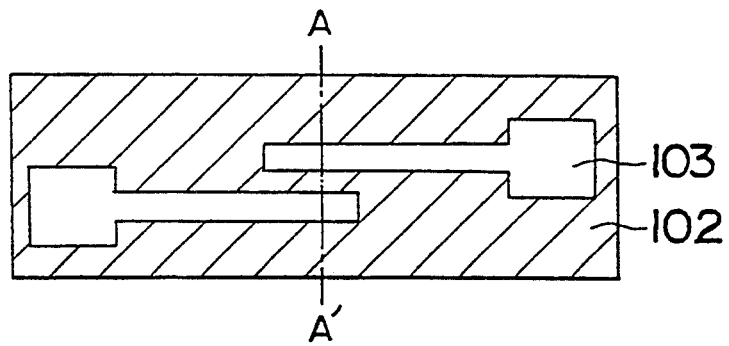
FIGS. 19(a)–19(f) show a method for producing the resonant electron transfer device according to an eighth embodiment of the present invention.
Figure 19B:
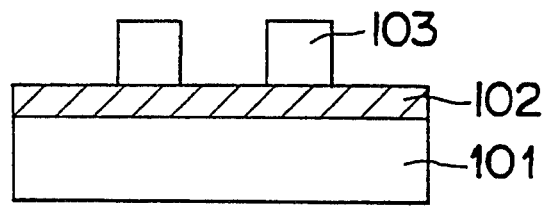
Figure 19C:
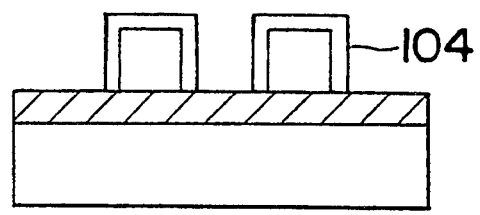
Figure 19D:
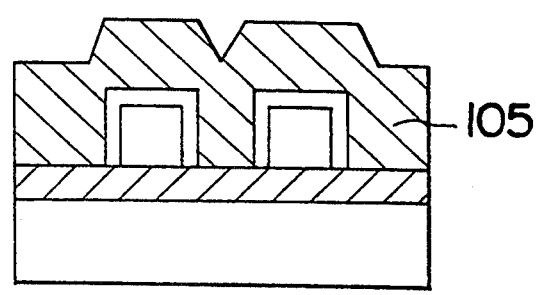
Figure 19E:
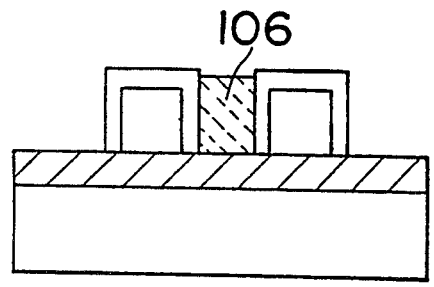
Figure 19F:
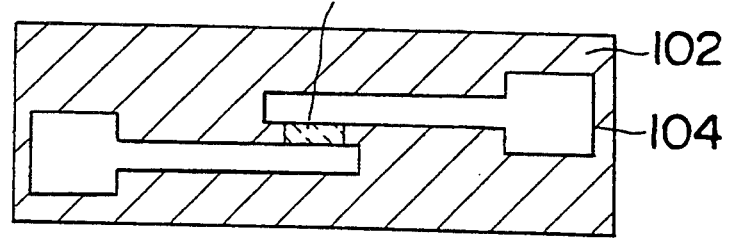
Figure 21:
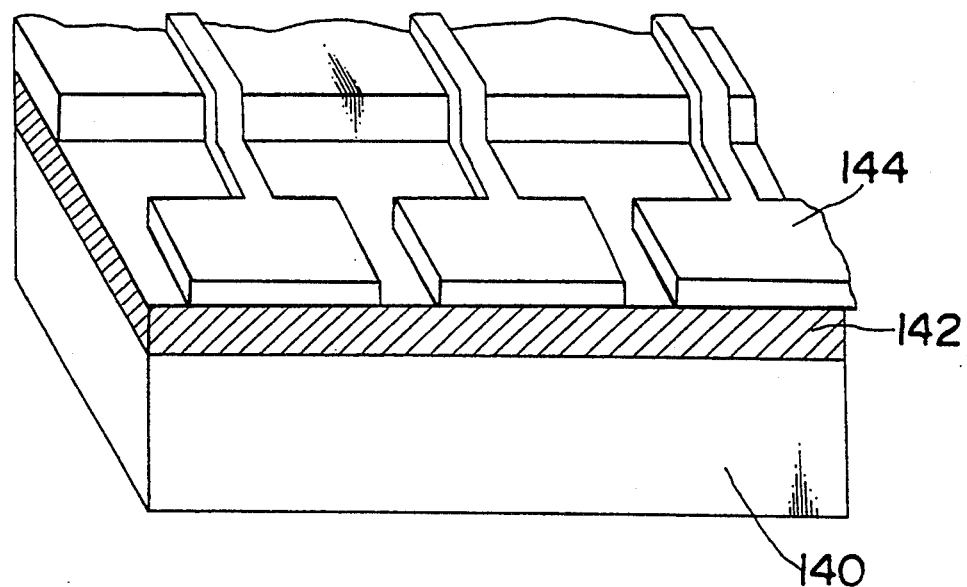
FIG. 21 is a constitutional perspective view of a conventional CCD.

FIG. 19(a) is a plan view, showing that on a silicon substrate 101 a silicon oxide film 102 and two specified shaped monocrystalline silicon quantum wires 103 are formed. Also, the two wires are provided adjacent to each other in the directions different from their longitudinal direction. FIG. 19(b) is a view taken on A-A' section in FIG. 19(a). In FIG. 19(c), thermal oxidation is carried out to form a silicon oxide film 104 on the peripheral part of the quantum wire 103. In FIG. 19(d), a polycrystal silicon 105 is piled up. In FIG. 19(e), a polycrystal silicon 105 is etched in a specified shape to obtain the quantum dot 106 held between the two quantum wires 103 and silicon oxide films 104. FIG. 19(f) is a view of this state from above.

In this embodiment, the precision required of the mask setting to the quantum wire 103 in the lithography process in etching the polycrystal silicon 105 and forming a quantum dot 106 can be greatly relaxed. FIGS. 20(a)-20(d) are views showing the mask setting precision required at this time. FIG. 20(a) shows this in the longitudinal direction (direction X) of the quantum wire 103. There is obtained a margin of the length corresponding to the length of the overlaying in the X-direction of the two quantum wires. FIG. 20(b) shows the state in the longitudinal direction and the vertical direction (direction Y), where there is obtained a margin proportional to the width of the quantum wire 103 in the direction Y in forming the resist 107. Also, when there is formed a deviation from setting by more than the width in the Y direction of the quantum wire 103, as shown in FIG. 20(e), after etching the polycrystal silicon 105, the resist 107 is removed, and then anisotropic etching is carried out again, by which there only remains as a residue 108 which is perfectly separated from the quantum dot 106, and the operation characteristics of the quantum wire 103 and the quantum dot 106 are not affected. As a result, the greater margin is to be obtained in the direction Y. As described above, according to this embodiment, there is obtainable a method for producing a resonant electron transfer device comprising the two quantum wires and a quantum dot held between them with the insulating film therebetween, in which the setting margin of lithography is large and easy to manufacture.

In the present embodiment, the quantum dot 106 comprising a polycrystal silicon 105 may be subjected to monocrystallization processing by a charge particle beam or laser annealing process.

As described above, according to this embodiment, it becomes possible to prepare a device which is made by combining a quantum wire and a quantum dot and which is easily miniaturized.

As described above, because this invention employs a resonant tunneling effect between the dissipated quantum levels in the one-dimensional quantum wire and the zero-dimensional quantum dot as a principle of the electron propagation, it is possible to provide an extremely high speed electron transfer device. Also, as this device shows small dispersion of energy level in the zero-dimensional quantum dot, high efficiency signal propagation with a small leakage current can be realized. It is also possible to realize the electron propagation in an optional direction in the two-dimensional network. Further, writing-in and reading-out of the electron signals to the quantum dot become possible, and the memory function can be realized.

Although the present invention has been fully described in connection with the preferred embodiments thereof with reference to the accompanying drawings, it is to be noted that various changes and modifications are apparent to those skilled in the art. Such changes and modifications are to be understood as being included within the scope of the present invention as defined by the appended claims unless they depart therefrom.

What is claimed is:

1. A resonant electron transfer device comprising:
   a plurality of one-dimensional quantum wires each having a quantum well elongated in one direction;
   a plurality of zero-dimensional quantum dots each having a quantum well whose lowest quantum energy level is higher than that of said quantum wire of said one-dimensional quantum wire; and
   a plurality of electrodes formed on said quantum wires and quantum dots for controlling internal potentials of respective quantum wires and quantum dots;
   wherein said plurality of quantum wires and quantum dots are arranged alternately so as to form a predetermined connection structure;
   wherein one of said quantum wires and an adjacent one of said quantum dots are connected via a potential barrier capable of exhibiting a tunnel effect therebetween;
   and wherein information is transmitted from one of said quantum wires to one of said quantum dots or vice versa in accordance with controlling voltages supplied to said plurality of electrodes.

2. The resonant electron transfer device as claimed in claim 1, wherein said predetermined connection structure comprises a series connection of a plurality of units each comprised of one quantum wire and one quantum dot.

3. The resonant electron transfer device as claimed in claim 2, wherein each of said plurality of units is commonly controlled by each one of said plurality of electrodes.

4. The resonant electron transfer device as claimed in claim 1, wherein said plurality of electrodes comprises first and second groups and wherein each electrode of said first group controls the internal potential of each of said plurality of quantum wires and each electrode of said second group controls the internal potential of each of said plurality of quantum dots.

5. The resonant electron transfer device as claimed in claim 1, wherein said predetermined connection includes a plurality of units each comprised of a pair of said one-dimensional wires arranged in parallel and one zero-dimensional quantum dot which is connected between said pair of said one-dimensional wires.

6. The resonant electron transfer device as claimed in claim 5, wherein said plurality of electrodes includes a first electrode for controlling internal potentials of one of said one-dimensional quantum wires and said one zero-dimensional quantum dot of said unit and a second electrode for controlling internal potentials of another one-dimensional quantum wire and the same zero-dimensional quantum dot of the same unit.

* * * * *